US010570005B2

(12) United States Patent
Murarka et al.

(10) Patent No.: US 10,570,005 B2
(45) Date of Patent: Feb. 25, 2020

(54) METHOD AND APPARATUS FOR RELEASE-ASSISTED MICROCONTACT PRINTING OF MEMS

(75) Inventors: Apoorva Murarka, Cambridge, MA (US); Vladimir Bulovic, Lexington, MA (US); Sarah Paydavosi, Arlington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 13/604,613

(22) Filed: Sep. 5, 2012

(65) Prior Publication Data

US 2014/0054732 A1 Feb. 27, 2014
US 2015/0076632 A9 Mar. 19, 2015

Related U.S. Application Data

(63) Continuation of application No. PCT/US2012/052549, filed on Aug. 27, 2012, and a continuation-in-part of application No. 12/636,757, filed on Dec. 13, 2009, now Pat. No. 8,739,390, and a continuation-in-part of application No. 12/903,149, filed on Oct. 12, 2010, now Pat. No. 8,963,262.

(Continued)

(51) Int. Cl.
*B81B 3/00* (2006.01)
*B81C 1/00* (2006.01)

(52) U.S. Cl.
CPC ........ *B81B 3/0021* (2013.01); *B81C 1/00158* (2013.01); *B81C 1/00492* (2013.01);

(Continued)

(58) Field of Classification Search
CPC ... G01L 9/0042; G01L 9/0044; G01L 9/0045; G01L 9/0048; B81B 3/0021;

(Continued)

(56) References Cited

U.S. PATENT DOCUMENTS 5,862,239 A 1/1999 Kubli et al.
6,243,474 B1 6/2001 Tai et al.

(Continued)

OTHER PUBLICATIONS

"Characterization of Aligned Wafer-Level Transfer of Thin and Flexible Parylene Membranes," by Hanseup Kim and Khaalil Najafi, Journal of Microelectromechanical Systems, vol. 16, No. 6, Dec. 2007, pp. 1386-1396.*

(Continued)

*Primary Examiner* — Matthew C Landau
*Assistant Examiner* — Mark Hatzilambrou
(74) *Attorney, Agent, or Firm* — Spectrum IP Law Group LLC

(57) ABSTRACT

The disclosure provides methods and apparatus for release-assisted microcontact printing of MEMS. Specifically, the principles disclosed herein enable patterning diaphragms and conductive membranes on a substrate having articulations of desired shapes and sizes. Such diaphragms deflect under applied pressure or force (e.g., electrostatic, electromagnetic, acoustic, pneumatic, mechanical, etc.) generating a responsive signal. Alternatively, the diaphragm can be made to deflect in response to an external bias to measure the external bias/phenomenon. The disclosed principles enable transferring diaphragms and/or thin membranes without rupturing.

15 Claims, 19 Drawing Sheets

580
500
550

Related U.S. Application Data

(60) Provisional application No. 61/528,148, filed on Aug. 27, 2011, provisional application No. 61/138,014, filed on Dec. 16, 2008, provisional application No. 61/251,255, filed on Oct. 13, 2009.

(52) U.S. Cl.
CPC ................. *B81B 2203/0127* (2013.01); *B81C 2201/0194* (2013.01)

(58) Field of Classification Search
CPC ........ B81B 2203/0127; B81C 1/00158; B81C 220/0194
USPC ............................................ 156/719; 438/53
See application file for complete search history.

(56) References Cited

U.S. PATENT DOCUMENTS

| | | | |
|---|---|---|---|
| 7,439,093 | B2 | 10/2008 | Beaudry |
| 7,816,710 | B2 | 10/2010 | Palmateer et al. |
| 7,893,919 | B2 | 2/2011 | Kothari et al. |
| 8,087,152 | B2 | 1/2012 | Kato et al. |
| 2006/0186874 | A1* | 8/2006 | Mackin et al. ............ 324/158.1 |
| 2009/0236310 | A1* | 9/2009 | Linder ................ B81C 1/00246 216/49 |
| 2010/0188796 | A1* | 7/2010 | Bulovic et al. ............... 361/280 |
| 2010/0255426 | A1* | 10/2010 | Jain ...................... G02B 5/0833 430/322 |

OTHER PUBLICATIONS

"Micropatterning metal electrode of organic light emitting devices using rapid polydimethylsiloxane lift-off," by Jennifer Yu and Vladimir Bulovic, Applied Physics Letters 91, 043102, Jul. 23, 2007.*

International Search Report and Written Opinion dated May 28, 2013 for PCT Application No. PCT/US12/052549.

* cited by examiner

METHOD AND APPARATUS FOR RELEASE-ASSISTED MICROCONTACT PRINTING OF MEMS

The application claims the filing-date priority to PCT Application No. PCT/US12/52549 filed Aug. 27, 2012 (which claims priority to Provisional Application No. 61/528,148 filed Aug. 27, 2011; and is a continuation-in-part ("CIP") of application Ser. No. 12/636,757, filed Dec. 13, 2009 (which claims priority to Provisional Application No. 61/138,014, filed Dec. 16, 2008); and is a CIP of application Ser. No. 12/903,149, filed Oct. 12, 2010 (which claims priority to Provisional Application No, 61/251,255, filed Oct. 13, 2009). The disclosure of each of these applications is incorporated herein in its entirety.

BACKGROUND

Field of the Disclosure

The disclosure relates to method and apparatus for microcontact printing of microelectromechanical systems ("MEMS"). More specifically, the disclosure relates to a novel method and apparatus for release-assisted microcontact printing of MEMS.

Description of Related Art

MEMS applied over large areas would enable applications in such diverse areas as sensor skins for humans and vehicles, phased array detectors and adaptive-texture surfaces. MEMS can be incorporated into large area electronics. Conventional photolithography-based methods for fabricating MEMS have provided methods and tools for producing small features with extreme precision in processes that can be integrated with measurement and control circuits. However, the conventional methods are limited to working within the existing silicon semiconductor-based framework. Several challenges, including expense, limited size and form-factor, and a restricted materials set, prevent the future realization of new MEMS for applications beyond single chip or single sensor circuits. Standard processing techniques are particularly restrictive when considering expanding into large area fabrication. Conventional photolithography methods are also incompatible with printing flexible substrate MEMS and micro-sized sensor arrays.

For example, in creating free-standing bridges, cantilevers or membranes from limited material, the conventional methods require surface or bulk micromachining, a series of photolithographic masking steps, thin film depositions, and wet chemical or dry etch releases. Such steps require investing in and creating highly specialized mask sets which render conventional photolithography expensive and time and labor intensive. While the initial investment can be recovered by producing large batches of identical MEMS devices, the conventional methods are cost prohibitive for small batches or for rapid prototype production.

Conventional MEMS have been based on silicon and silicon nitride which are deposited and patterned using known facile processes. Incorporating mechanical elements made of metal on this scale is difficult because of the residual stresses and patterning challenges of adding metal to the surface. This is because metals are resistant to aggressive plasma etching. As a result, conventional MEMS processing apply liftoff or wet chemical etching. The surface tension associated with drying solvent during these patterning steps or a later immersion can lead to stiction (or sticking) of the released structure. Stiction dramatically reduces the production yield.

Another consideration in some large area applications is flexibility. Although photolithography is suitable for defining high fidelity patterns on planar and rigid substrates, it is difficult to achieve uniform registration and exposure over large areas. Display technologies have been among the first applications to create a market for large area microelectronics. To meet the challenges of new markets for large area electronics, alternative means to patterning have been proposed which include: shadow masking, inkjet printing, and microcontact printing. These techniques are often the only options available for organic semiconductors and other nanostructured optoelectronic materials, some of which have particularly narrow threshold for temperature, pressure and solvent. Conventional methods are not suitable for MEMS using organic semiconductors, nanostructured optoelectronic materials which may be fabricated on a flexible substrate.

An alternative approach is to fabricate electronic structures directly on flexible sheets but polymeric substrates offering this flexibility are typically limited to low-temperature processing as they degrade under high temperature processing. Accordingly, high temperature processing such as thermal growth of oxides and the deposition of polysilicon on a flexible substrate cannot be supported by conventional processes. Another approach is to fabricate structures on silicon wafers, bond them to a flexible sheet, and then release the structures from the silicon by fracturing small supports or by etching a sacrificial layer. However, this approach tends to locate the structures on the surface having the highest strain during bending.

Therefore, there is a need for an improved process that addresses these and other shortcomings of the art.

SUMMARY

The disclosure provides methods and apparatus for release-assisted microcontact printing of MEMS. The principles disclosed herein enable patterning diaphragms (interchangeably, membranes) on a substrate having articulations of desired shapes and sizes. Such diaphragms deflect under applied pressure or force (e.g., electrostatic, electromagnetic, acoustic, pneumatic, mechanical, etc.) generating a responsive signal. Alternatively, the diaphragm can be made to deflect in response to an external bias. The disclosed principles enable transferring thin diaphragms without rupturing the diaphragm. The diaphragm can define a single material or a composite of different materials or layers.

In one embodiment, the disclosure provides a method for forming a MEMS device by contacting a support structure having a diaphragm formed thereon with the MEMS structure. The contact results in transfer of the diaphragm from the support structure onto the MEMS structure. The support structure includes a release layer separating a substrate from the diaphragm. A diaphragm of desired shape and thickness is thus formed over the release layer. The release layer is weakened prior to transferring the diaphragm in order to ease the contact-transfer process. The diaphragm can have varying surface thickness and area. In an exemplary embodiment, the diaphragm had a surface area of less than 0.2 $mm^2$. In another embodiment, the diaphragm surface area was about 0.2-16 $mm^2$. In still another embodiment the diaphragm surface area was larger than 16 $mm^2$. In another exemplary embodiment, the membrane area is as small as 100 $nm^2$ or less.

In another embodiment, the disclosure relates to a method for forming a MEMS structure. The method includes the steps of: providing a MEMS structure having an articulation thereon; interposing a release layer between a first surface of an electrode and a substrate; contacting a second surface of the electrode with the MEMS structure to form an interim structure; activating the release layer in the interim structure to separate the substrate from the first surface of the electrode; removing the substrate from the interim structure to form an electrode at least partially covering the articulation. The step of contacting a second surface of the electrode with the MEMS structure may additionally include adhering the second surface to the MEMS structure to at least partially cover the articulation. In another embodiment, the interim structure is exposed to a vapor to activate the release layer. The vapor may contain one or more solvents. Alternatively, the interim structure may be exposed to heat and/or radiation to activate the release layer. Activating the release layer is intended to reduce adhesion of the release layer, thereby allowing separation and transfer of the electrode from one surface to another. The articulation may be a cavity, an aperture, a dimple, a post, a pillar or a plurality of ridges. A plurality of cavities, apertures or dimples can also be interconnected to each other by generating channels between them or by connecting adjacent cavities, apertures or dimples to each other. The MEMS structure can be a patterned metal feature, an insulator, a semiconductor, a conductive material, two conductive materials separated by an insulator, an organic material, a viscoelastomer, a polymer or a combination thereof.

In another embodiment the disclosure relates to a pressure sensor. The pressure sensor includes an array of cavities formed in a substrate, each cavity having a hollow interior separating a top portion and a bottom portion; a diaphragm layer formed over the array; a first electrode communicating with the plurality of diaphragm layers defining a plurality of complementary electrodes; a meter in communication with the plurality of complementary electrodes for detecting a capacitance change between at least one first electrode and its respective diaphragm when an external signal impacts the diaphragm. The sensor may also include a controller in communication with the meter, the controller can have a processor circuit in communication with a memory circuit, the controller receiving a signal from the meter and identifying a pressure change corresponding to the received signal. In another embodiment, the controller communicates with the meter, the controller having a processor circuit in communication with a memory circuit and the controller receiving a signal from the meter and identifying a change in capacitance corresponding to the received signal. In still another implementation, at least one of the complementary electrode pairs determines a change in potential between the first electrode and the diaphragm when the diaphragm is deflected. In yet another embodiment, the array defines a plurality of pixels in which the diaphragm can independently be addressed.

In another embodiment, the disclosure relates to a method for forming a MEMS structure. The method comprises the steps of: providing a MEMS structure having an array of articulations in which at least two adjacent articulations are separated by a pitch distance; providing a support structure, the support structure having a first and a second release layers interposed between a substrate and a diaphragm; exposing the support structure to one of a first solvent or a first energy source configured to dilute or dissociate the first release layer; contacting a second surface of the electrode with the MEMS structure to form an interim structure; exposing the interim structure to one of a second solvent or a second energy source configured to dilute or dissociate the second release layer; and removing the substrate from the interim structure to form an electrode at least partially covering the two adjacent articulations. The step of exposing the release structure to a solvent, an energy source or a combination thereof can be identified as the activating step. The first release layer and the second release layer can be identical or different material. The first release layer can be an organic release layer decomposable by solvent and the second release layer can be photo- or heat-sensitive and decomposable by radiation or heat energy. The interim structure can be exposed to solvent or energy in a chamber or a housing adapted to receive the structure.

A transducer according to an embodiment of the disclosure includes a plurality of cavities formed on a substrate, the cavities organized in rows and columns wherein at least two adjacent cavities are separated by a pitch distance and wherein the plurality of cavities define a first group and a second group; a diaphragm layered over the first and the second group of cavities; a first electrode communicating with the first plurality of cavities; a second electrode communicating with the second plurality of cavities; a controller having a processor circuit in communication with a memory circuit, the controller independently communicating with each of the first group and the second group of cavities. The controller may activate the first group of cavities independently of the second group of cavities. The activation of the cavities can be done by applying a bias voltage/current. Once biased, the diaphragm expands or contracts responsive to the supplied bias. Conversely, the diaphragm may expand or contract responsive to an external bias (e.g., pressure, acoustic or electrostatic force). In this manner, the deflection of the diaphragm can be registered and measured to determine the intensity of the external bias. In an exemplary implementation, a plurality of addressable cavities are identified in which the controller can manipulate the diaphragm independently.

BRIEF DESCRIPTION OF THE DRAWINGS

These and other embodiments of the disclosure will be discussed with reference to the following exemplary and non-limiting illustrations, in which like elements are numbered similarly, and where.

DETAILED DESCRIPTION

Figure 1A:
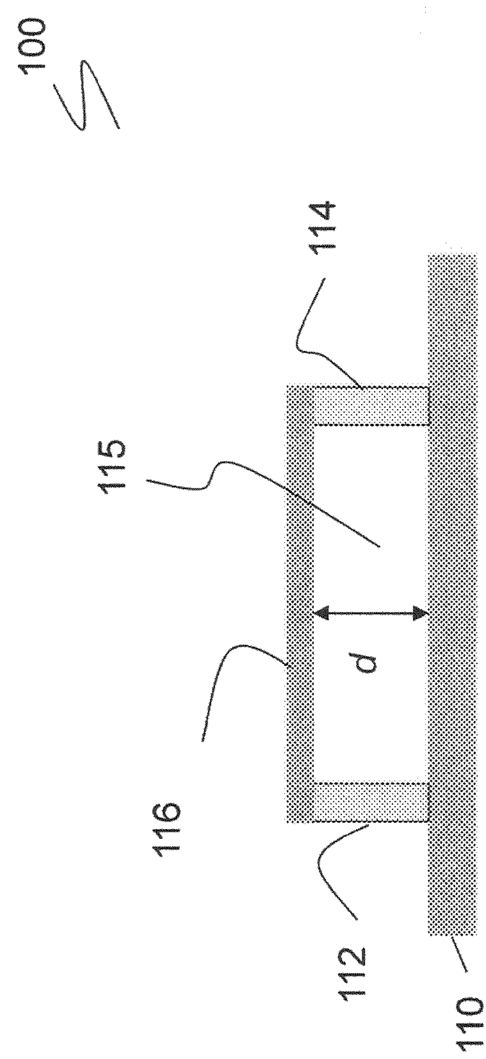
FIG. 1A is a schematic representation of a conventional MEMS device.

FIG. 1A is a schematic representation of a conventional MEMS device. MEMS 100 includes substrate 110 having supports 112 and 114. Supports 112 and 114 can be viewed as a plurality of ridges separated by gap 115. Supports 112 and 114 uphold diaphragm 116. Gap 115 is defined by the separation distance between ridges 112 and 114 and by the height (d). Conventionally, diaphragm 116 is defined by a metal layer and MEMS structure 100 is formed through photolithography. As stated, the conventional processes lacked ability to produce MEMS devices over large areas and on flexible substrates.

Figure 1C:
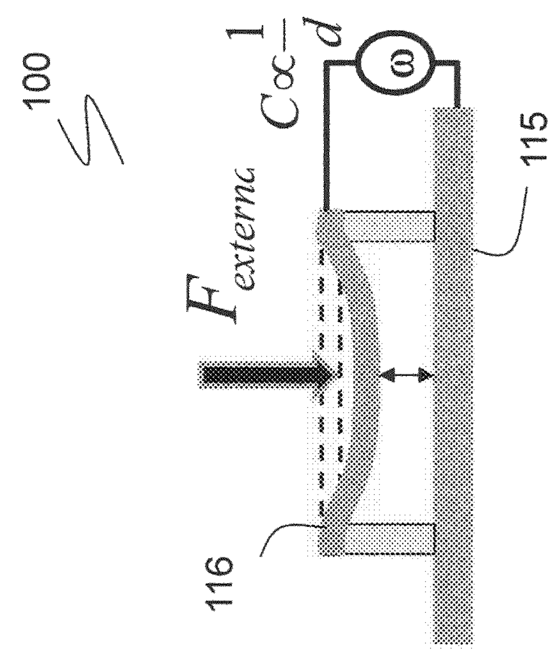
FIG. 1C shows an application of the MEMS device of FIG. 1A as a sensor.
Figure 1B:
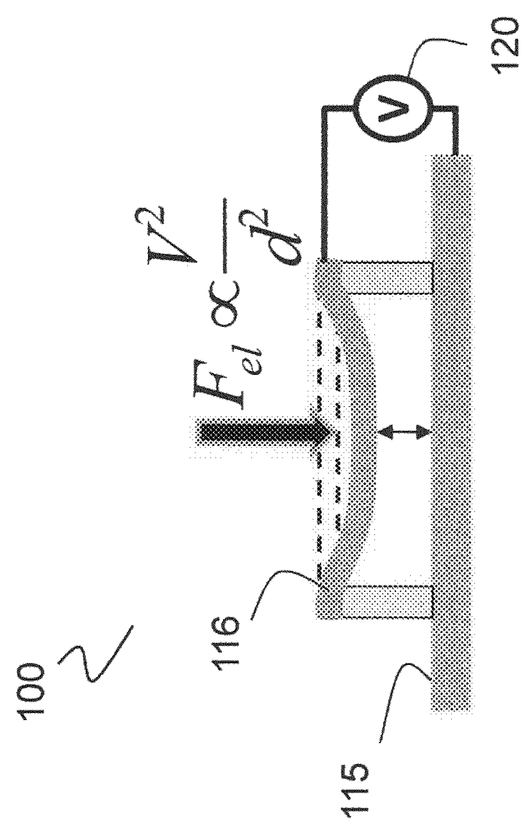
FIG. 1B shows an application of the MEMS device of FIG. 1A as an actuator.

FIG. 1B shows an application of the MEMS device of FIG. 1A used as an actuator. In FIG. 1B, structure 100 is connected to voltage source 120 through substrate 115 (fixed electrode) and diaphragm 116 (deflecting electrode). The bias provided by voltage source 120 creates an electrostatic force between fixed electrode 115 and diaphragm 116, causing the latter to deflect towards fixed electrode 115. The relationship between the electrostatic force and the deflection is described in Equation 1 as follows:

$$F_{el} \propto V^2/d^2 \quad (1)$$

In Equation 1, $F_{el}$ denotes the electrostatic force, V is the bias voltage and d is the separation distance between substrate 115 and metal layer 116.

FIG. 1C shows an application of the MEMS device of FIG. 1A for use as a sensor. In FIG. 1C, external force $F_{ext}$ is applied to MEMS structure 100 causing deflection in diaphragm 116. The external force is measurable as it creates a change in capacitance (C) of device 100. The capacitance can be determined by Equation 2 as follows:

$$C \propto 1/d \quad (2)$$

Any material which can be formed into a film can be used as a diaphragm. Such materials include viscoelastic polymers and conductive films. A conductive material such as a metal, a conducting metal oxide, graphene sheet, molybdenum disulfide sheets, polymer thin film, metal oxide/nitride/sulfide membrane or a doped polymer can be used as diaphragm. Additionally, boron nitride and similar two-dimensional (2D) conducting, insulating, semiconducting, or superconducting sheets can also be used as a diaphragm. In another embodiment, an electrically insulating membrane is coated with a conductive layer to form a diaphragm. The diaphragm can comprise a patterned metal feature, an insulator, a semiconductor material, a conductive material, two conductive materials separated by an insulator, an organic material or a combination thereof.

Figures 2A, 2B, 2C, 2D:
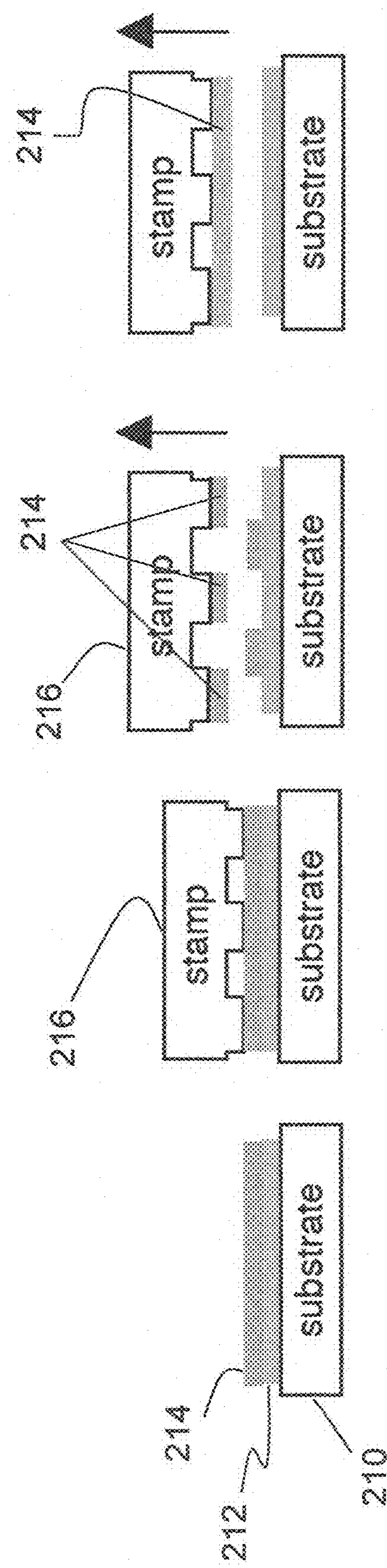
FIGS. 2A-2D are schematic representations of a method for constructing electrodes.

FIGS. 2A-2C are schematic representations of a method for constructing electrodes according to one embodiment of the disclosure. The method can be defined as lift-off patterning. The exemplary method starts in FIG. 2A by providing substrate 210 (fixed electrode) having thereon release layer 212 and metal film 214. Substrate 210 can comprise glass, plastic, PDMS, silicon or silicon-based substrates, quartz, metals and other suitable material.

Release material 212 may include conventional release material. A preferred release layer comprises N,N'-diphenyl-N-N'-bis(3-methylphenyl)-(1,1'-biphenyl)-4,4'-diamine ("TPD"), $Alq_3$ or other organic material having a desired thickness. The thickness of the release layer is a function of the release material. Exemplary implementation of release layer having thickness of 90-250 nm have proved successful. The release layer can be as thin as a monolayer. The metal layer preferably comprises a material capable of acting as an electrode (deflecting electrode) or a diaphragm. In one embodiment, metal layer 214 defines a gold layer with a thickness in the range of 70-250 nm. The metal layer can be deposited, for example, through shadow masking over the release layer.

Next, as illustrated in FIG. 2B, a MEMS structure (i.e., stamp 216) having a support layer and a plurality of ridges is provided. The ridges in FIG. 2 are exemplary and other features or articulations including pillars, dimples, mesas and cavities may also be used. A plurality of cavities, apertures or dimples can also be interconnected to each other by generating channels between them or by connecting adjacent cavities, apertures or dimples to each other. The MEMS structure is prepared as a function of its intended use. A common MEMS structure which can be used in applications ranging from pressure sensors to array detectors includes a base layer supporting a plurality of ridges. The base layer can act as the fixed electrode. The ridges can be spaced apart such that each pair of adjacent ridges is separated by a gap. The gap size can be configured to accommodate the desired MEMS function. In non-limiting exemplary embodiments, the gap height was as small as 0.2 nm, as large as 500 μm and heights there between. The width of the gap, cavity, dimple, or articulation can be as small as a couple of nanometers or larger for desired application. In FIG. 2C, the stamp is lifted from the substrate, removing with it a layer of release material. Here, metal film 214 breaks off at the gaps such that portions adhere to stamp 216 while other portions adhere to release layer 212. In an alternative embodiment shown in FIG. 2D, metal layer 214 remains intact after separation such that metal layer 214 forms a diaphragm over the stamp ridges as shown.

Successful patterning also depends on the film thickness. In one embodiment of the disclosure thin metal films having a thickness of less than 20 nm replicated features as small as 13 μm. Thicker metal films having thickness in excess of about 100 nm are generally highly resistant to patterning. Instead, these thick films are seen to produce continuous film transfer across discontinuous stamp surfaces (see FIG. 2D). By engineering the transfer process according to the film thickness, the suspended membranes and bridges which are used in many MEMS devices can be created in an additive process.

Figure 3:
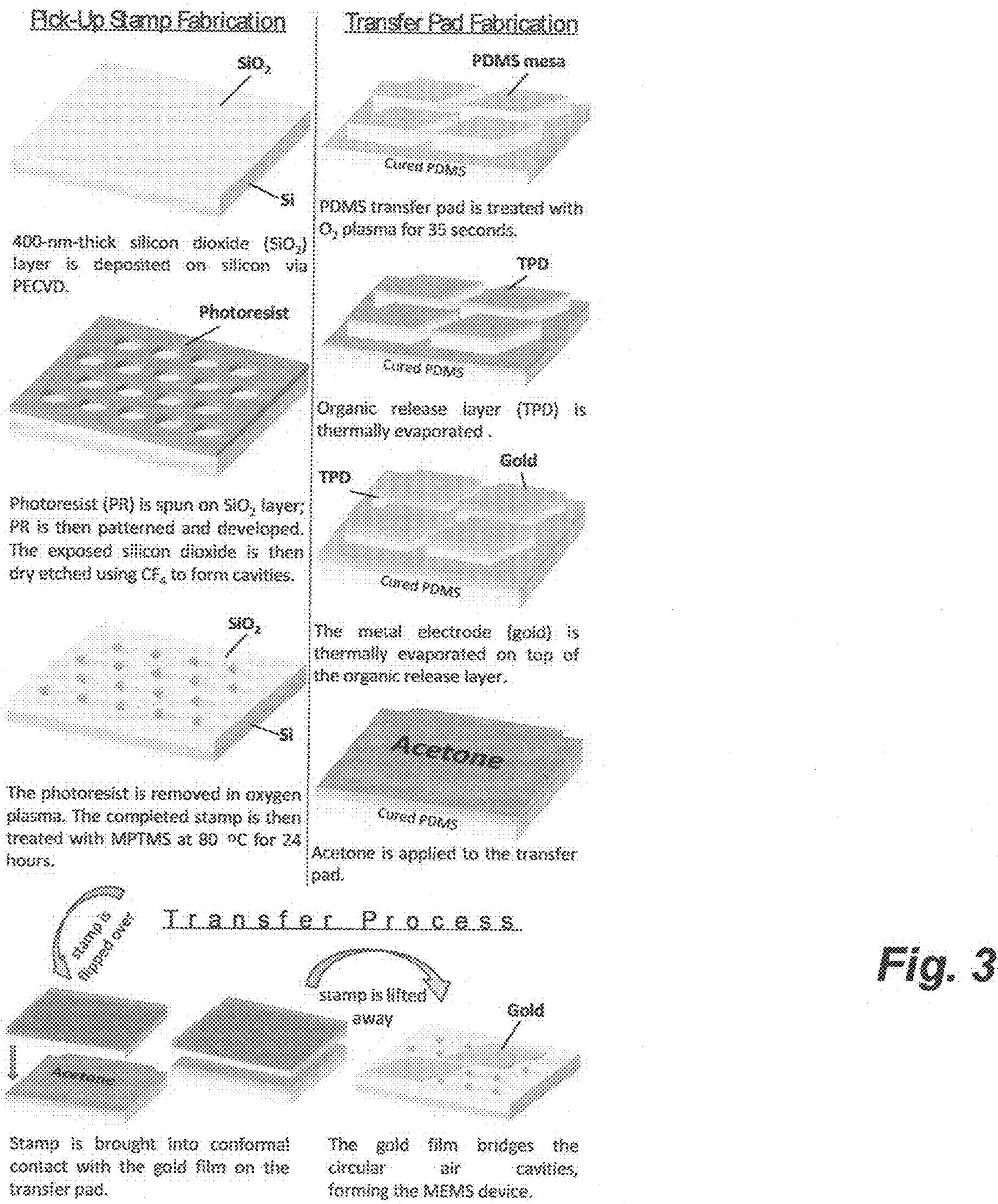
FIG. 3 pictorially illustrates an exemplary process for release-assisted contact-transfer fabrication of MEMS.

FIG. 3 pictorially illustrate an exemplary process for release-assisted contact-transfer fabrication of MEMS. The process of FIG. 3 can be viewed as a three-part process. In the pick-up stamp fabrication process, a silicon dioxide ($SiO_2$) layer was deposited on a silicon (Si) substrate by plasma-enhanced chemical vapor deposition. The silicon dioxide layer had a thickness of about 400 nm. Next, a photoresist (PR) layer was spun over the $SiO_2$ layer. The PR layer was then patterned and developed. Thereafter, the PR layer was dry etched using $CF_4$ to form cavities. The photoresist was removed in oxygen plasma and the completed stamp was treated with 3-mercaptopropyltrimethoxysilane ("MPTMS") at about 80° C. for about 24 hours.

In the transfer pad fabrication process, PDMS transfer pad was treated with oxygen plasma for about 35 seconds to form cured PDMS. Next, an organic release layer of TPD was thermally evaporated over the PDMS mesas. The metal diaphragm (gold) was thermally evaporated on top of the organic release layer.

Finally, acetone was applied to the transfer pad in order to activate the release layer prior to the transfer process. The acetone treatment is intended to substantially weaken, degrade, dissolve, dilute or dissociate (activate) the release layer. The degradation may be a chemical degradation in which the release layer is treated with one or more solvents in order to weaken the intermolecular forces/bonds of the release layer. By degrading the release layer, delamination of the diaphragm from the underlying layer is significantly expedited. Suitable solvents for weakening the release layer may include acetone, methyl ethyl Keaton (MEK), water or other conventional solvents. The weakening of the release layer may be done before or after the step of contacting the MEMS structure with the diaphragm-supporting structure. As will be discussed further below, the weakening of the release layer may also be done by exerting energy, alone or in combination with a solvent.

The third and final step of the process is the transfer process whereby the pick-up stamp is brought into conformal contact with the gold film on the transfer pad. The pick-up stamp is then lifted away from the diaphragm, resulting in the diaphragm bridging the cavities of the stamp. In the exemplary embodiment of FIG. 3, the Si layer acts as the fixed electrode and the gold diaphragm acts as the deflecting electrode. The two electrodes are separated by the cavities formed in the $SiO_2$ layer.

Figure 4A:
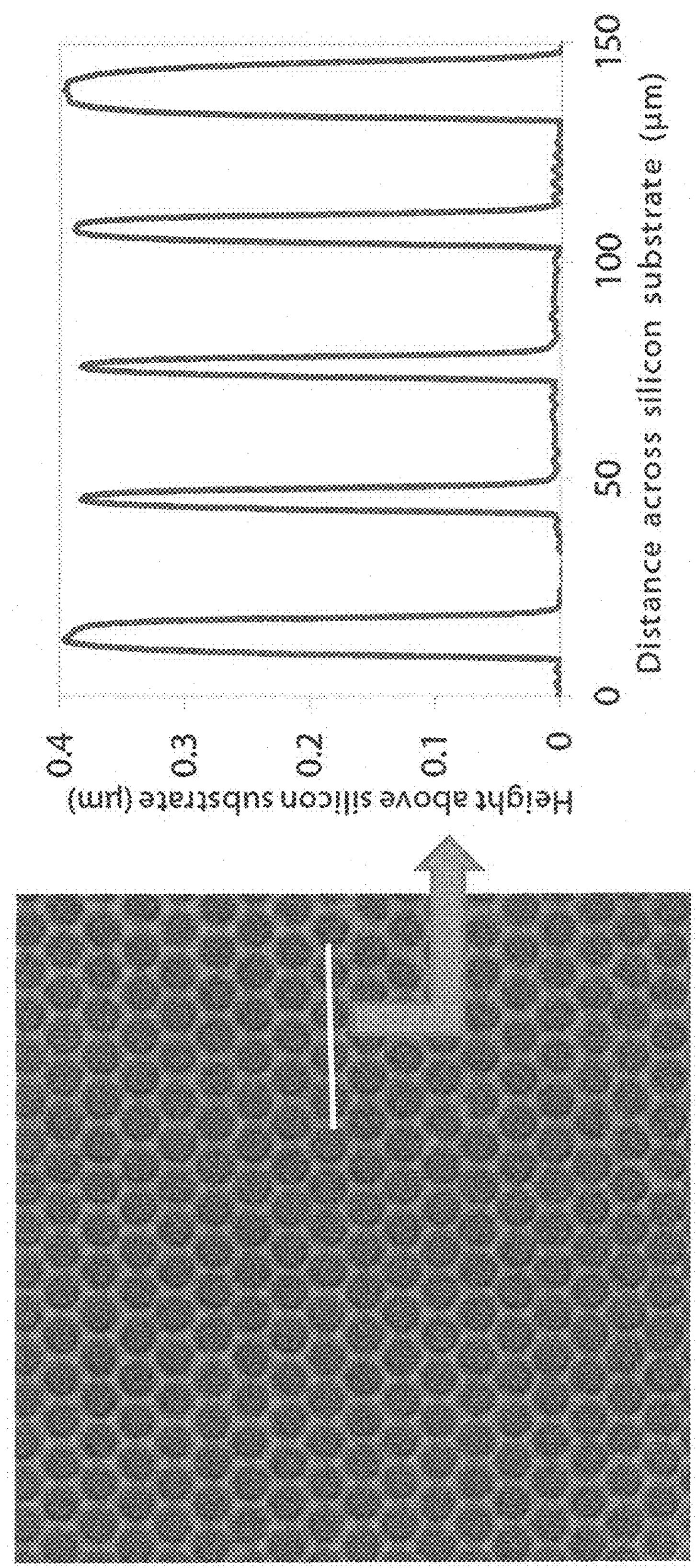
FIG. 4A is a contact profilometry scan of the pick-up stamp according to one embodiment of the disclosure.

FIG. 4A is a contact profilometry scan of the pick-up stamp made according to one embodiment of the disclosure. As seen in FIG. 4, the pick-up stamp consisted of 400 nm thick $SiO_2$ spacer layer on a silicon substrate. The $SiO_2$ spacer layer was patterned with circular cavities in a hexagonal-close-packed arrangement. The cavities can be formed in silicon, polysilicon, silicon dioxide, metal, insulator, metal coated with an insulator, silicon dioxide on silicon, other silicon based substrates, quartz and other suitable material. While the exemplary embodiment of FIG. 4A shows a constant the pitch distance between the cavities, the disclosed principles are not limited thereto and include varying pitch distances on the same MEMS structure.

Figure 4B:
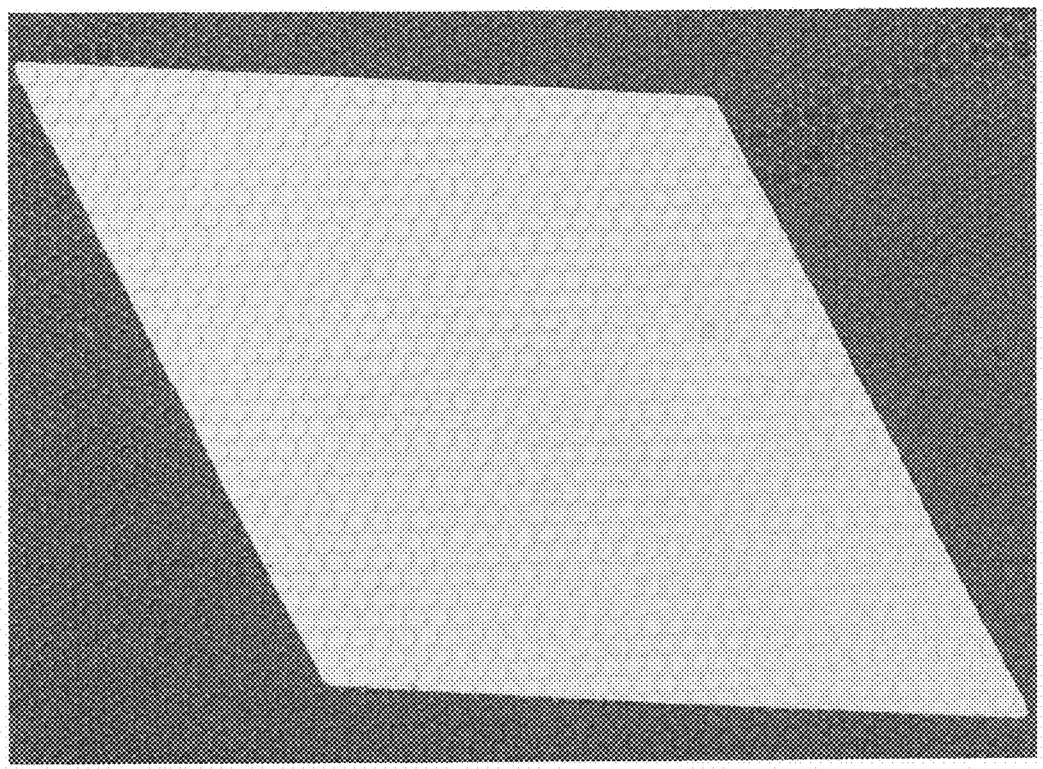
FIG. 4B is an optical microscopy image of a gold diaphragm formed according to one embodiment of the disclosure.

FIG. 4B is an optical microscopy image of a 0.8 $mm^2$ area gold diaphragm formed according to one embodiment of the disclosure. Specifically, FIG. 4B shows a MEMS capacitor array of about 1024 cavities covered by a single 125+/−15 nm thick gold diaphragm. The diaphragm was formed using solvent-assisted contact transfer process exemplified in FIG. 3. The underlying $SiO_2$ layer was patterned with about 27 μm diameter circular cavities with 4 μm pitch spacing. It should be noted that the diaphragms disclosed herein can comprise of single material or a composite of different materials including conductive material, non-conductive material and/or a combination thereof. Non-limiting and exemplary diaphragm material include gold, silver, alloys or combinations thereof. In addition, the diaphragm may comprise a combination of a conductive and a non-conductive material.

In an embodiment of the disclosure, an insulating layer is formed between the diaphragm (top deflectable electrode) and substrate (bottom fixed electrode) to prevent shorting. For the PDMS MEMS devices, this can be a thin layer of PDMS. For the silicon dioxide or silicon-based MEMS structures, the insulating layer can be about 30 nm thick layer of silicon dioxide or silicon nitride.

Figures 5A, 5B, 5C:
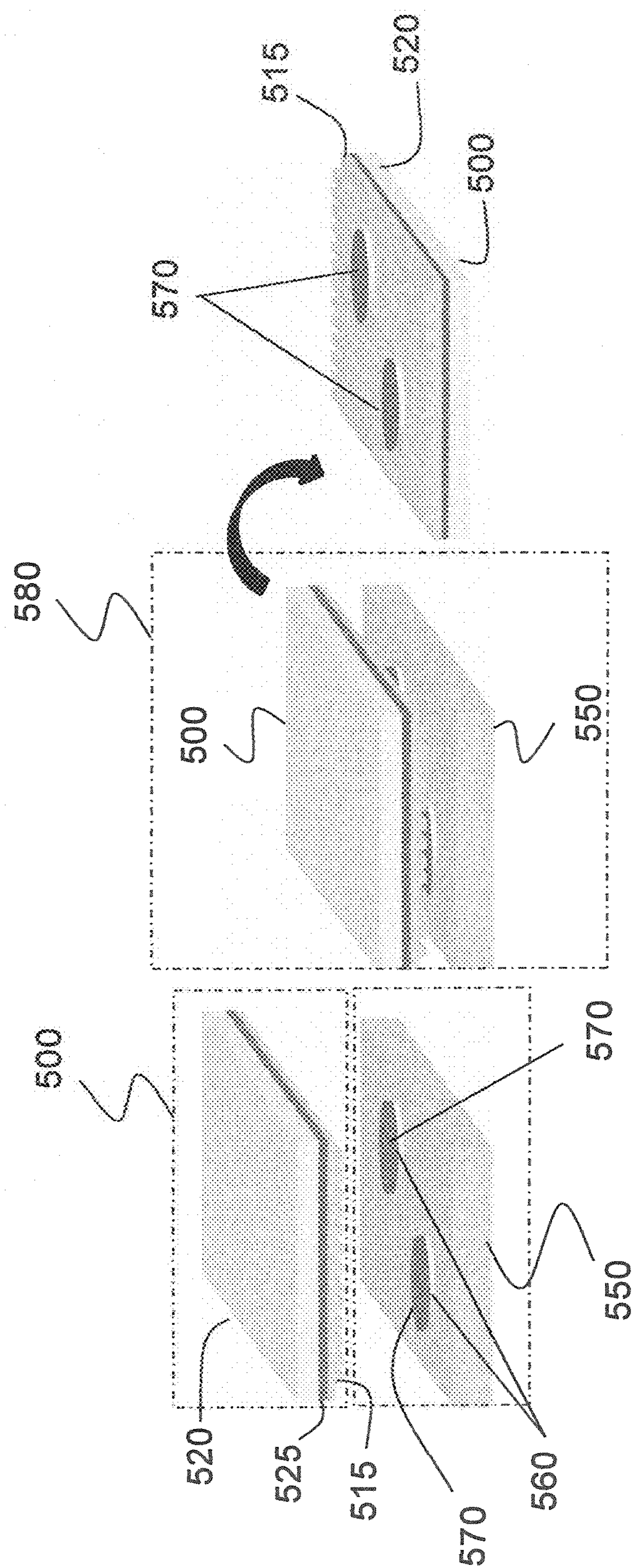
FIG. 5 shows an exemplary process for PDMS lift-off transfer.

FIGS. 5A-5C show an exemplary process for contact-transfer printing according to another embodiment of the disclosure. Here, a MEMS structure and a diaphragm support structure were used to illustrate contact transfer. MEMS structure 500 includes electrode 525 and PDMS 515. PDMS 515 is defined by proximal and distal sides. The proximal side of PDMS 515 faces electrode 525. The distal side of PDMS 515 includes a plurality of ridges that are spaced apart. Support structure 550 includes release layer 560 and metal diaphragm (deflecting electrode) 570.

In FIG. 5B, MEMS structure 500 and transfer pad 550 are brought into conformal contact. The combination of MEMS structure 500 and transfer pad 550 define interim structure 580. Each of the ridges formed on the distal end of PDMS 515 contacts metal diaphragm 570. The duration of the contact can be a function of the metal layer and the pressure applied. In FIG. 5C, MEMS structure 500 is peeled off from transfer pad 550. The peeling speed can be optionally considered to ensure substantial implementation of the process. A portion of the release layer 560 may also be removed along with the delaminated metal layer and transfers over to the MEMS structure. Conventional methods can be used to remove any excess release material transferred over to the MEMS structure 500. Once metal diaphragm 570 is transferred, the metal layer adheres to the ridges at the distal end of PDMS 515.

Release layer 560 can be weakened, diluted or dissociated prior to contacting transfer pad 550 with MEMS structure 500 (shown in FIG. 5A). This can be done, for example, by treating the release layer with an etchant. The etchant can be a solvent. In an embodiment where the release layer is an optically sensitive compound, it may be weakened by exposure to radiation. The release layer may also be selected so as to weaken by heating, cooling or upon exposure to electromagnetic waves. Weakening the release layer prior to forming the final MEMS structure of FIG. 5C eases the delamination step.

The release layer may also be weakened, diluted or dissociated after forming interim structure 580. Here, the interim structure 580 is exposed to one or more of solvent(s), vapor, heat or radiation to weaken release layer 560. For example, interim structure 580 can be exposed to vaporized solvent, such as acetone vapor, in a reaction chamber in order to weaken the release layer prior to delaminating or separating the MEMS structure. Heat and/or radiation can also be used separate from, or in addition to, the vapor to weaken the release layer. Weakening the release layer eases delamination and allows for quicker recovery of the final MEMS structure.

The contact delamination of FIGS. 5A-5C can be implemented on diaphragm films of different thicknesses. In one embodiment, a metal layer having thicknesses between 80-140 nm was delaminated. Weakening the release layer enables contact-transfer of even thinner films. Once transferred, the diaphragm forms a suspended membrane over the articulations of the MEMS structure.

Figure 6:
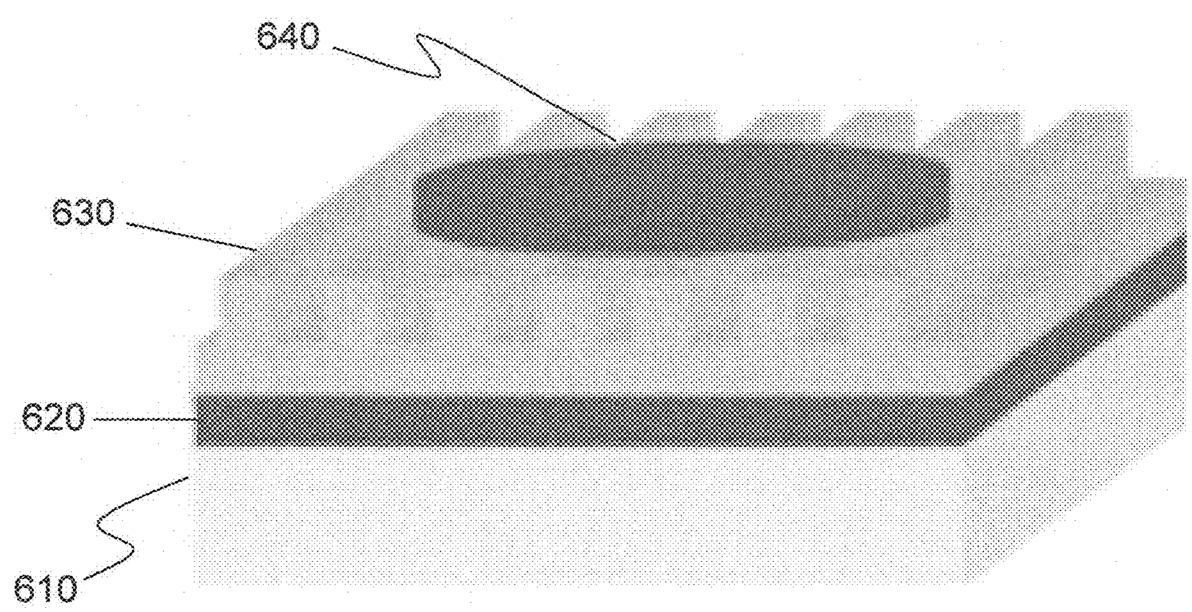
FIG. 6 schematically illustrates a MEMS structure prepared according to the process of FIG. 5.

FIG. 6 shows a MEMS structure prepared according to the process illustrated in FIGS. 5A-5C. The MEMS structure of FIG. 6 includes substrate 610 which supports electrode 620. Grating 630 is formed over the substrate and the diaphragm 640 is transferred over grating 630. In an exemplary implementation, gold diaphragm having 140 nm thickness was transferred over grating 630.

Figure 7:
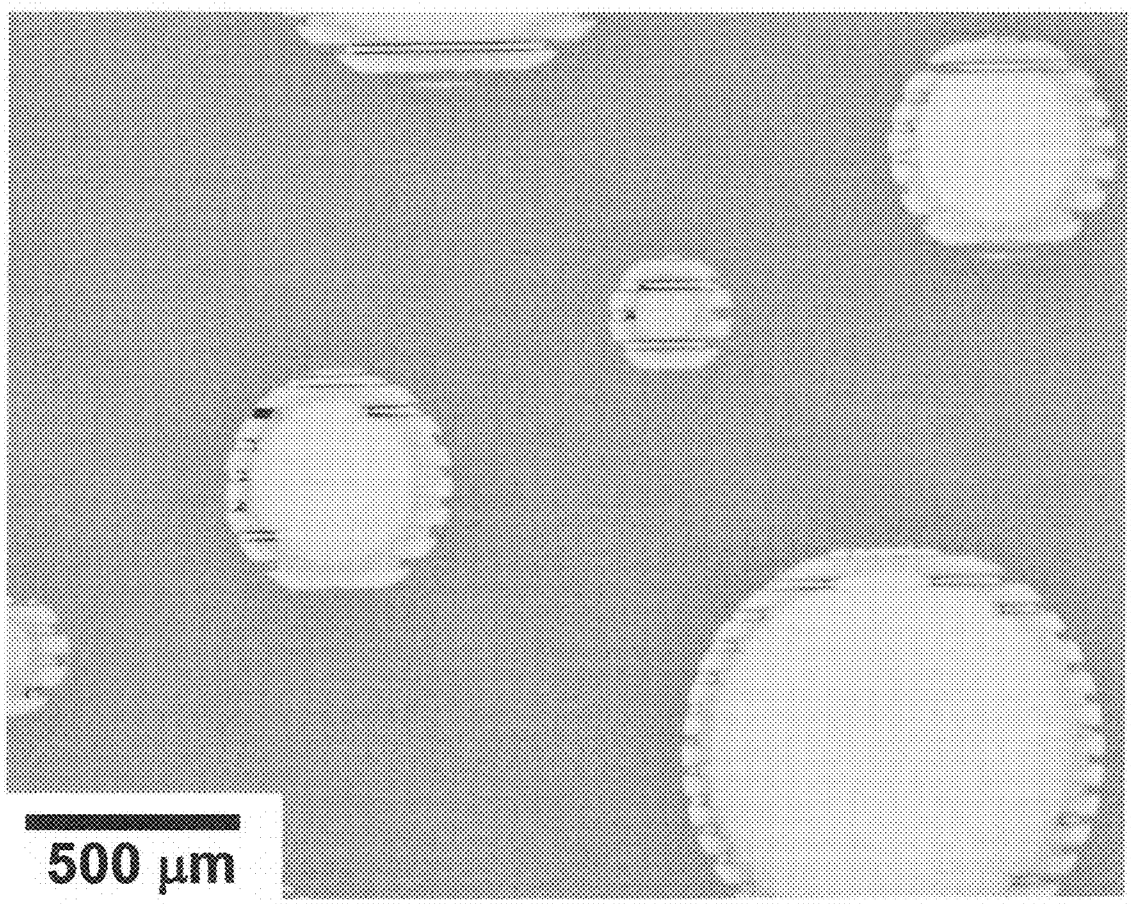
FIG. 7 is an optical micrograph of the MEMS devices whose structure is shown in of FIG. 6.

FIG. 7 is a top view of the MEMS structure of FIG. 6. Specifically, FIG. 7 shows an optical microscopy image of gold electrodes transferred onto a MEMS structure. As discussed in relation to FIG. 6, the transferred gold membrane is spread over the ridges of the MEMS support structure, making contact with a plurality of the ridges.

EXAMPLE 1

A MEMS device was fabricated on patterned-silicon-dioxide-on-silicon substrate ($SiO_2$ on Si) using contact-transfer stamping process outlined above. The fabrication steps comprised forming a transparency mask, forming the master mold, forming pick-up stamp substrates, forming transfer pad with raised mesas and contact-transfer of the mesa diaphragm onto the MEMS structure.

Photolithography Transparency Masks—The first step in fabricating the diaphragm involves making the transparency masks that define the desired geometry. The masks can be used in ultraviolet (UV) photolithography for patterning photoresists. UV photolithography was used for making SU-8 masters that were then used as molds for patterning the PDMS transfer pad. EPON SU-8 (MicroChem Corp.®; SU-8 3010) is a commonly used epoxy-based photoresist. The portion of SU-8 resist that is exposed to light becomes insoluble to the SU-8 photoresist developer, propylene glycol monomethyl ether acetate (PGMEA), while the unexposed portion of the SU-8 resist is dissolved away by the SU-8 developer. Two different transparency masks were made.

Mask A was designed to mold raised parallelogram mesas on the PDMS transfer pad. The formed parallelogram mesas were either 0.8 $mm^2$ or 0.2 $mm^2$ in area with internal angles of 60 degrees and 120 degrees to maximize the number of hexagonal-close-packed air cavities completely covered by each parallelogram. Mask B was designed to form circular air cavities in silicon dioxide layer on top of a conducting silicon substrate (or on top of any other conducting substrate). It formed cavities of about 12.5 μm in radius, that were hexagonal-close-packed with a spacing of about 5 μm between adjacent circles.

Forming SU-8 Master Molds—To fabricate the master mold for the transfer pad, SU-8 photoresist was spun onto silicon wafer. Specifically, SU-8 photoresist was poured onto the silicon wafer and the wafer was spun at 1000 rpm such that the SU-8 covered the entire surface of the wafer. This wafer was then spun at 3000 rpm for another 30 seconds. The wafer was then soft-baked at 95° C. for 5 minutes. The wafer was cooled for 2 minutes before being placed in an Amergraph UV exposure unit with Mask A placed on top of the SU-8 photoresist layer. The mask emulsion was in contact with the SU-8 layer. Mask A was used to make the SU-8 masters for the transfer pad. The SU-8 photoresist was then exposed to UV light. After UV exposure, the wafer was baked at 95° C. for 2 minutes. The wafer was then immersed in SU-8 developer solution (PGMEA) for 4 minutes while being agitated. Thereafter, the wafer was sprayed with PGMEA for 10 seconds to rinse off residual SU-8. An isopropanol wash was used to remove the PGMEA. The wafer was dried with nitrogen and hard-baked for 3 hours at 150-170° C. to finish the SU-8 masters. Following the hard bake, the SU-8 master mold was silanized with trichloro(1H,1H,2H,2H-perfluorooctyl)silane (Sigma-Aldrich®) to ensure easy removal of the cured PDMS.

Forming Pick-up Stamp Substrates—The pick-up stamp was fabricated by cleaning a silicon wafer using the standard Piranha process. Then a layer of silicon dioxide, about 300 nm to 12 μm thick, was grown on top of the silicon substrate wafer by plasma-enhanced chemical vapor deposition (PECVD). Following that, a photoresist was spun onto the silicon dioxide surface and was soft-baked by heating it at 95° C. Then a mask aligner was used to align Mask B to the silicon dioxide surface of the silicon substrate. The photoresist was exposed and developed. The undeveloped photoresist was washed away. The silicon dioxide was then dry etched with an etchant to get cavities in the silicon dioxide layer. The remaining resist was then removed with acetone or ashed away. The surface of the resulting pick-up stamp was modified via chemical treatment with an appropriate silane or other chemicals (for example 3-mercaptopropyltrimethoxysilane) to aid in the printing/transfer of the gold membrane. The partially-doped or highly-doped silicon substrate acts as the bottom electrode of the sensor or actuator MEMS. The silicon substrate can be replaced by a glass substrate with very thin (tens of nanometers thick) metal electrode patterns on its surface. The spacer layer silicon dioxide (which was eventually patterned) can then be grown/deposited atop this glass surface patterned with metal electrodes.

Transfer Pad with Raised Mesas—The transfer pad was fabricated by pouring PDMS (Sylgard 184, Dow Corning Co.®), mixed in a 10:1 base-to-curing-agent ratio by weight and degassed under vacuum, onto a silanized SU-8 master (can be silicon/metal/silicon dioxide/other material master also) with parallelogram troughs, in a petri dish. The PDMS was then cured in an oven at 50-60° C. for about 6 hours. The curing time and temperature can have a broad range depending on the experimental conditions. The cured PDMS transfer pad was then peeled from the SU-8 master.

The resulting transfer pad had raised parallelogram mesa structures that rise above the plane of the PDMS substrate. The mesas aid with the patterning and transfer of the gold electrodes because thermal evaporation is a line-of-sight process. After the curing process, the transfer pad was exposed to oxygen plasma (100 W, Plasma Preen, Inc.®) for about 30 seconds, after which a 90 nm thick organic release layer of N,N'-diphenyl-N,N'-bis(3-methylphenyl)-(1,1'-biphenyl)-4,4'-diamine (TPD, Luminescence Technology Co.®) and a 140 nm or 150 nm thick layer of gold were deposited in sequence via thermal evaporation onto the transfer pad to define the gold electrodes on the parallelogram mesas of the transfer pad. The gold electrode thickness of 80-140 nm can also be formed using the principles disclosed here. The thin gold films, vacuum-evaporated on top of the parallelogram mesas, broke along the sharp edges of the mesas defining a gold film in the shape of the parallelogram. Therefore, the raised areas on the transfer pad define, with sub-micron resolution, the shape of the gold electrodes that were lifted-off onto the pick-up stamps as the raised areas come into contact with the pick-up stamp.

Contact Lift-Off Transfer—Following the thermal evaporation, about 100 μL or less of acetone solvent was applied onto the gold-film-covered surface of the transfer pad. The amount of acetone depends on the area of the substrate that is being transferred. Before the solvent evaporated, the pick-up stamp with circular cavities was brought into contact with the parallelogram gold films on the mesas of the transfer pad. The pick-up stamp was then lifted-off to peel away and transfer the gold films onto the stamp such that the films covered the air cavities while forming the top electrode of the MEMS device.

The primary aim of using acetone solvent in this process was to dissolve away the organic layer (TPD) such that the gold films were delaminated from the underlying transfer pad substrate and were free to transfer onto the patterned silicon-based substrate/any substrate. It is noted that acetone is exemplary and a variety of solvents that can dissolve and/or etch the organic release layer can be used interchangeably. Different organic compounds that can be dissolved by solvents other than acetone may also be used as the organic release layer on the transfer pad. These materials can be subsequently dissolved by using the appropriate solvent(s). Another release layer is supercritical carbon dioxide. The supercritical carbon dioxide can be used as a release layer that can vaporize upon being heated to room temperature or higher to delaminate and release the diaphragm to the MEMS structure. Other supercritical materials can also be used as the release layer. The release layer may also be photo- or heat-sensitive such that its exposure to radiation or heat would expedite its dissolution and/or dilution/erosion/etching/weakening/dissociation.

Figure 8:
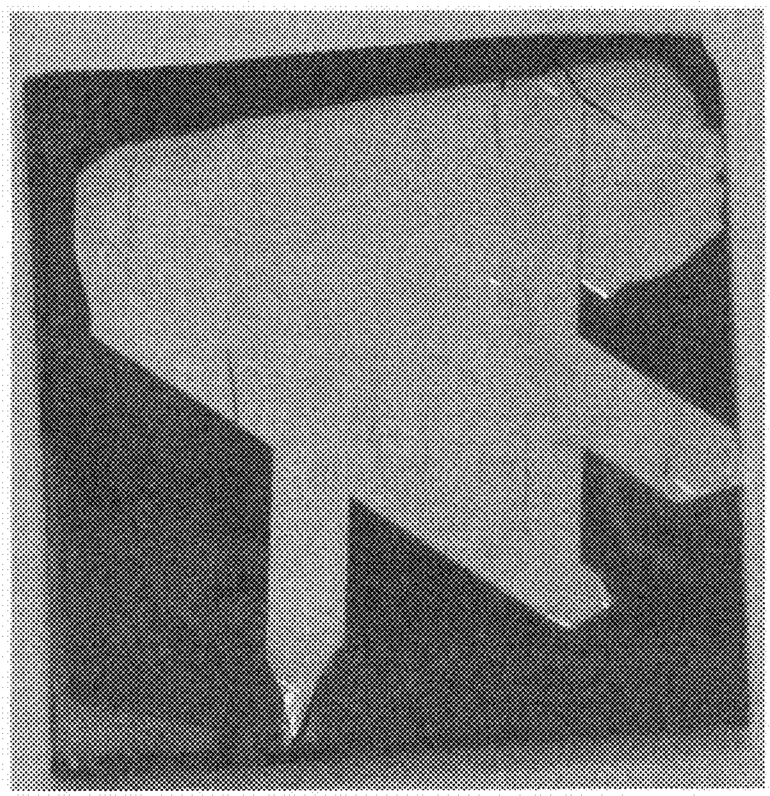
FIG. 8 shows photographs of gold diaphragms formed on a substrate using the release-assisted transfer technique.
Figure 8:
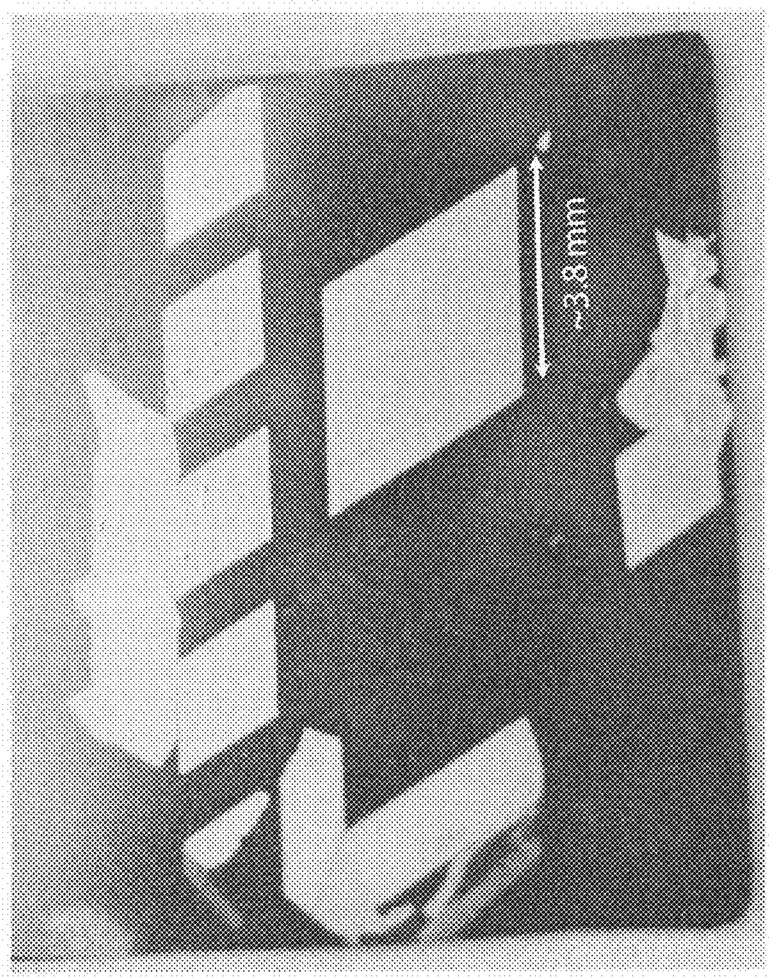

FIG. 8 shows photographs of two approximately 0.5"× 0.5" silicon substrates that are extensively covered in gold films transferred via the acetone-assisted contact transfer process. The yield (the area of gold picked-up and transferred per substrate) increases significantly due to the modification of transfer pad fabrication and spacer layer silanization parameters.

Figure 9:
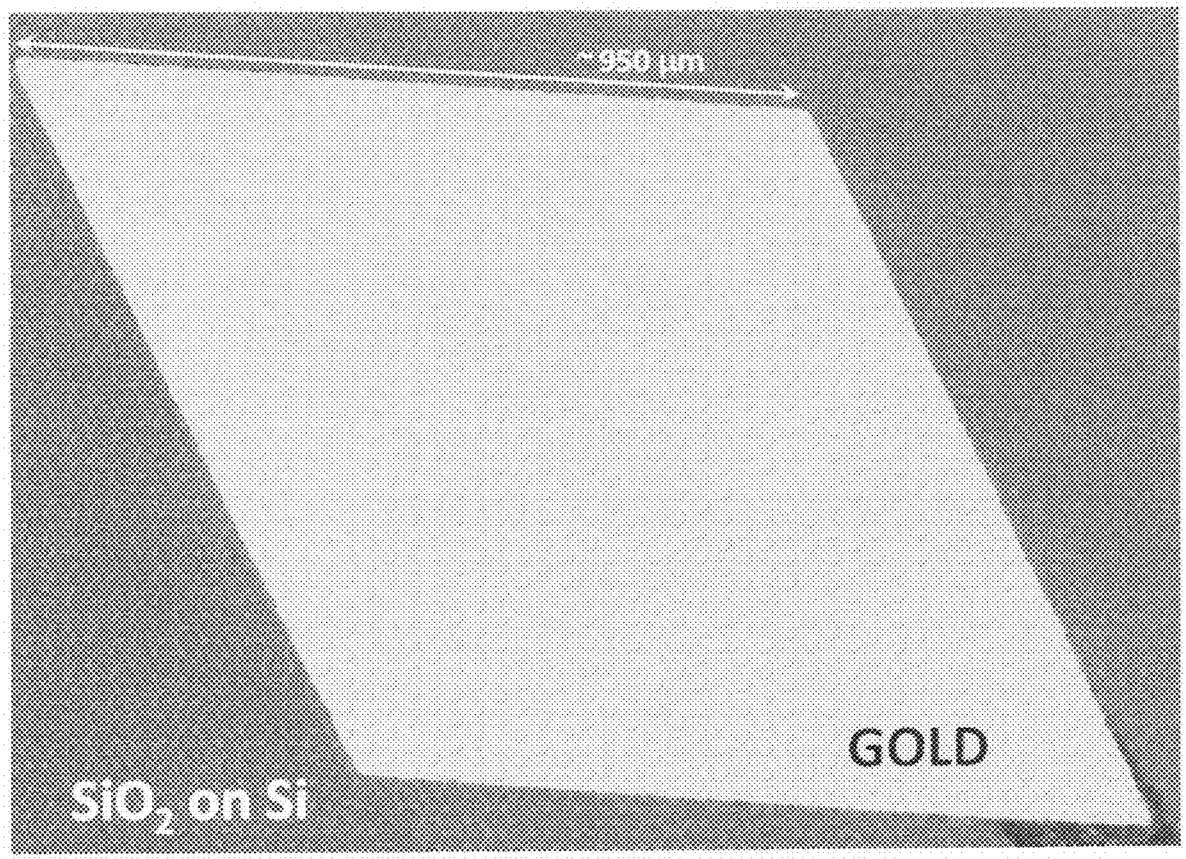
FIG. 9 shows a MEMS device formed according to an embodiment of the disclosure.
Figure 10:
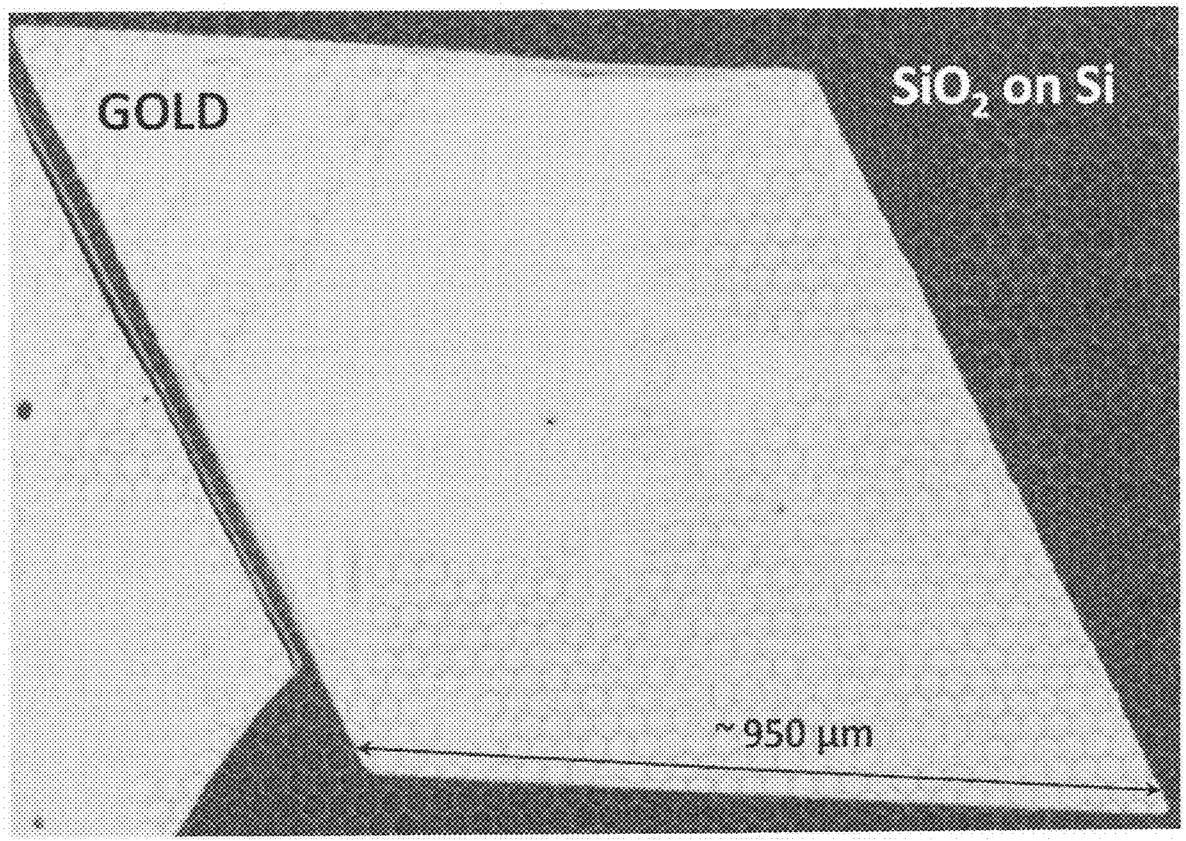
FIG. 10 shows a MEMS device in which the diaphragm is collapsed over a region of the device.

FIGS. 9 and 10 show examples of MEMS devices formed according to the release-assisted process of Example 1. Specifically, FIGS. 9 and 10 show a sensor array of about 1024 circular cavities covered by a gold diaphragm. The membrane was formed by the process of Example 1 and was about 140 nm thick. The underlying $SiO_2$ substrate comprised of cavities of 25-30 μm diameter, having a pitch distance of about 4-7 μm. The gold membrane can sink over some of the cavities during the fabrication process. The number of sunk cavities is dependent on the thickness of the dielectric spacer layer in the MEMS structure. In both FIGS. 9 and 10 portions of the diaphragm are collapsed over a region of the device.

The conductive membranes formed by the process of Example 1 were capable of deflecting and contorting repeatedly when a time-varying force or pressure was applied. The array demonstrated a repeatable gold membrane deflection of up to about 150-170 nm for 25-μm-diameter cavities by electrostatically actuating these devices at 15 V. The membranes were capable of being operated at lower and higher voltages, whether AC or DC, resulting in smaller or larger deflections. The deflection of these membranes has been confirmed with white light optical interferometry, as shown in FIGS. 11 and 12.

Figure 11:
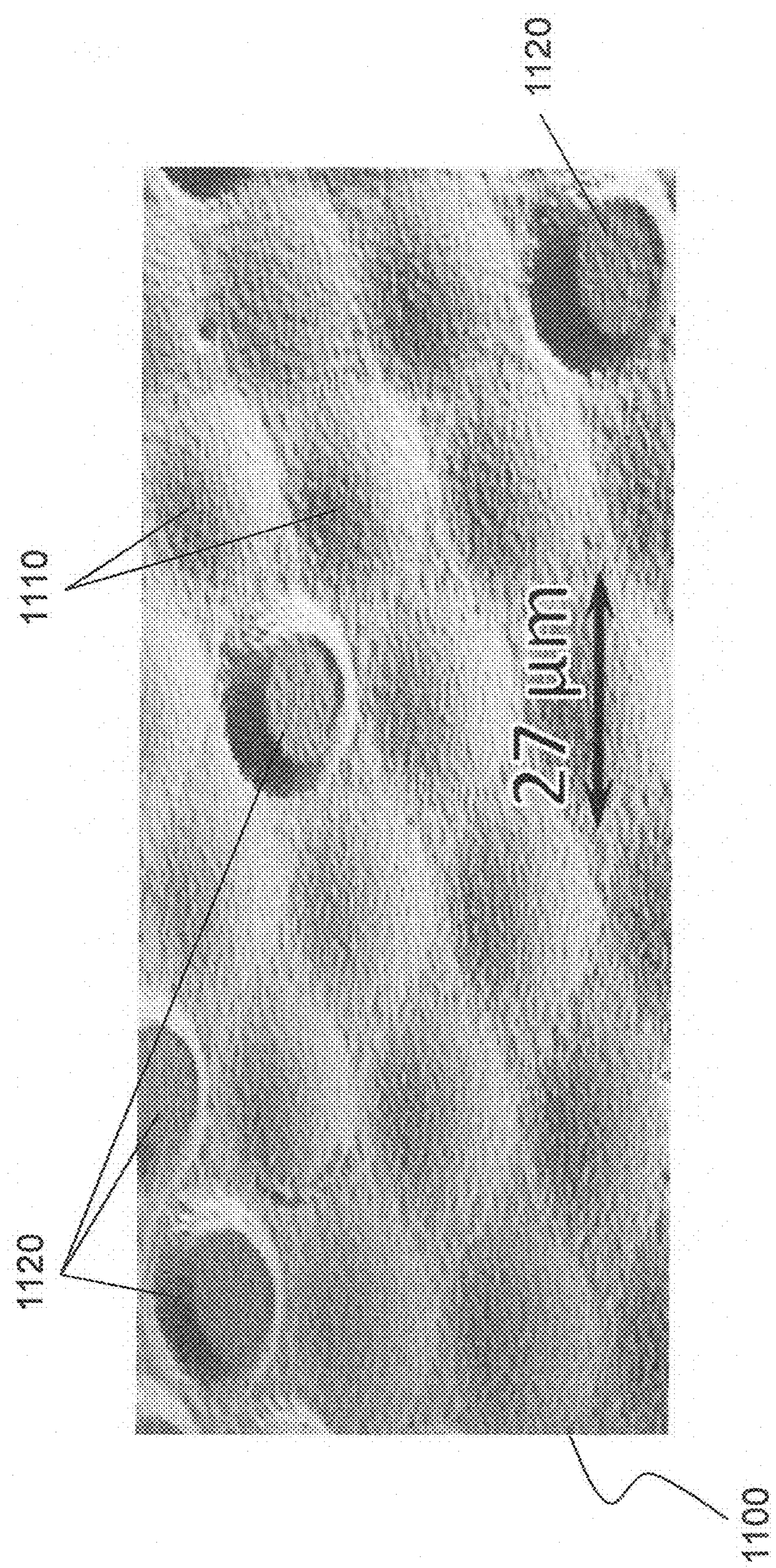
FIG. 11 shows an optical interferometry image of the gold diaphragm of Example 1 under 15 V (DC) actuation.

FIG. 11 is the optical interferometry image of the gold diaphragm of Example 1. Here, $SiO_2$ array 1100 has a gold diaphragm overlay which can be used, among others, as a pressure sensor. The gold diaphragm above most sensor cavities 1110 shows about 150 nm of deflection at the cavities' center under 15 V DC actuation. The diaphragm at certain location in the array was irreversibly sunken due to repetitive testing at 40 V. These locations are shown as cavities 1120 in the array 1100.

Figure 12:
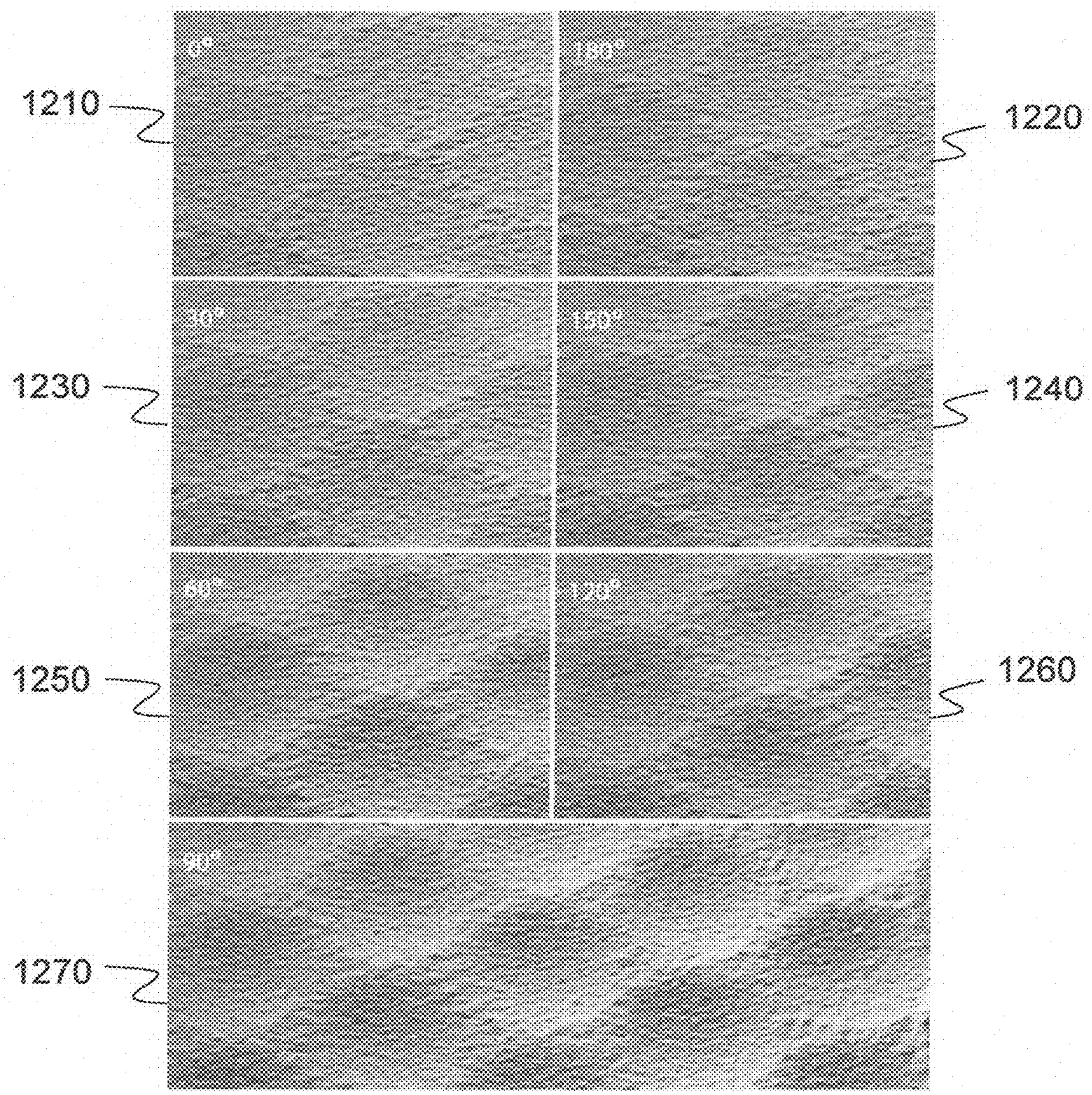
FIG. 12 shows the optical interferometry image of the gold diaphragm under AC actuation at different phase angles.

FIG. 12 shows the optical interferometry image of the gold diaphragm under AC actuation at different phase angles. Specifically, FIG. 12 shows optical interferometry images of several cavities when activated by an AC voltage of about 15 V peak-to-peak amplitude sinusoidal voltage actuation. The cavities are about 27 μm in diameter. Each of FIGS. 1210, 1220, 1230, 1240, 1250, 1260 and 1270 were taken at 30° phase intervals. Thus, interferometry 1210 and 1220 are taken at 0° and 180°, respectively and show substantially no diaphragm deflection. Interferometry 1230 and 1240 correspond respectively, to 30° and 50° phases and show minimal deflections. Interferometry 1250 and 1260 correspond respectively, to 60° and 120° phases and show limited deflections. FIG. 12 shows that maximum deflection of the diaphragm occurs at the sinusoidal signal peak, i.e., when the phase is at 90°.

Figure 13:
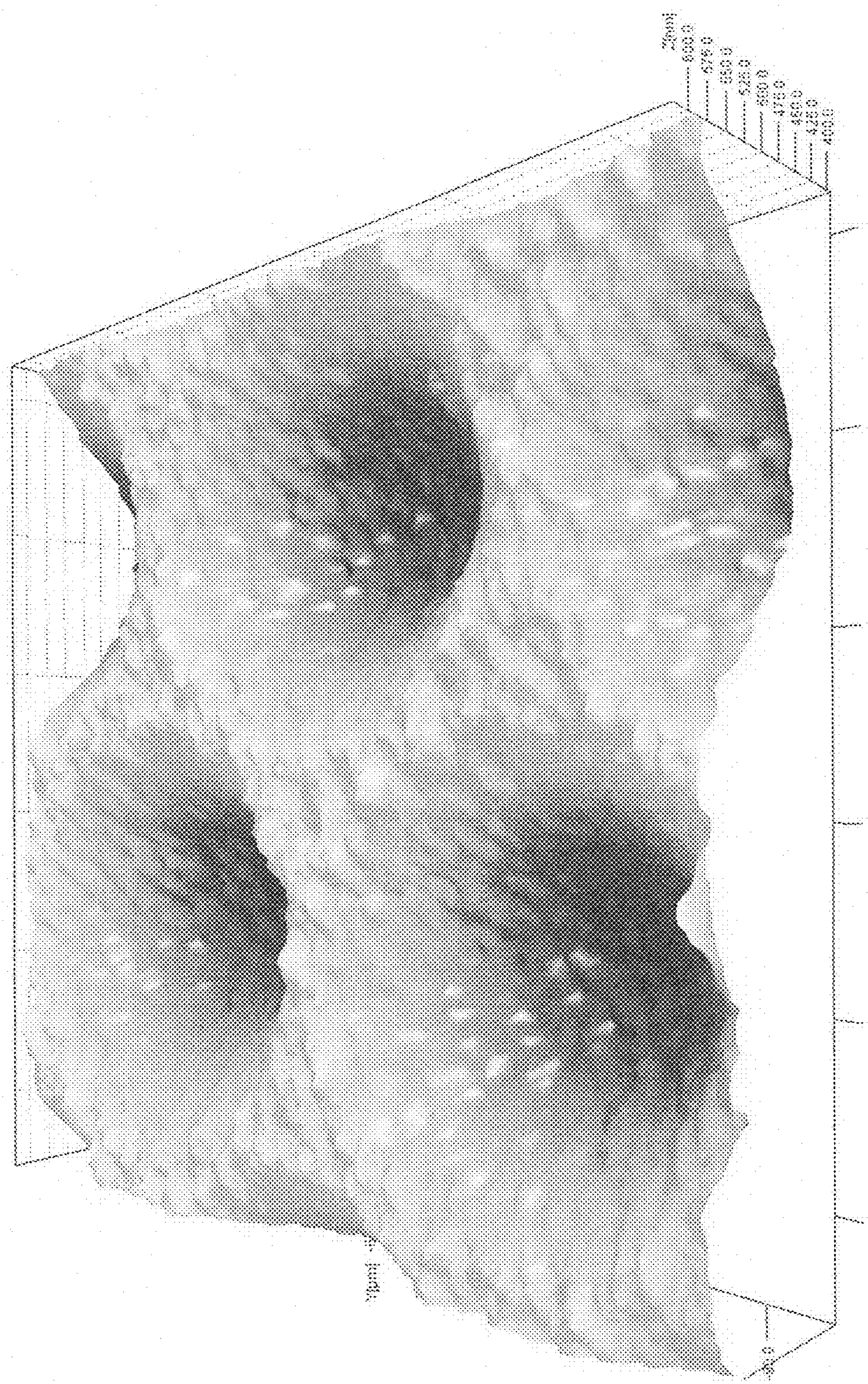
FIG. 13 is an optical interferometry image of the deflected gold diaphragm due to external bias.

FIG. 13 is a 3D image of the deflected gold diaphragm due to an external bias. FIG. 13 was obtained using optical interferometry and shows a deflection of about 150 nm depth at the center of the active cavities. The array shown in FIG. 11 was biased with 15 V. The diameter of each cavity was about 27 μm.

Figure 14:
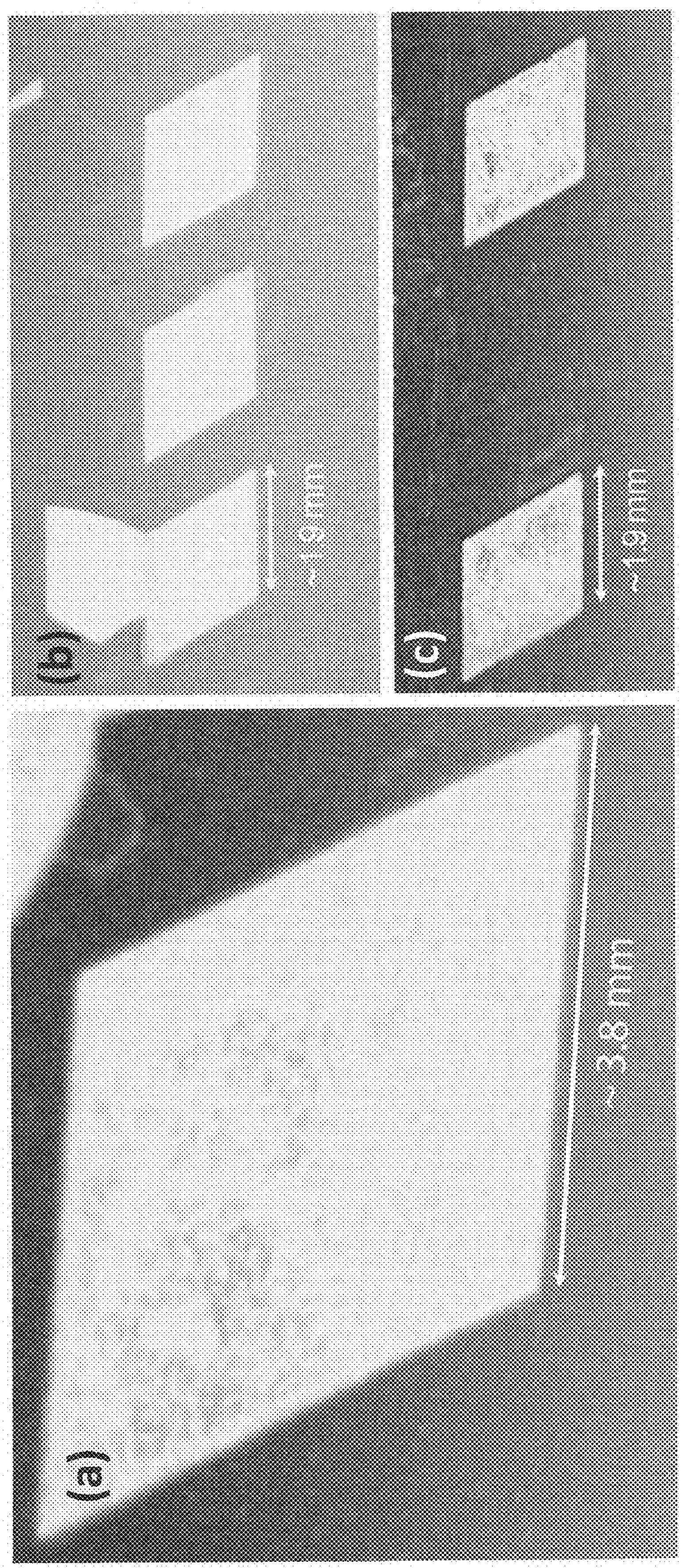
FIGS. 14A-14C show large area diaphragms formed according to the disclosed embodiments.

FIGS. 14A-14C show large area diaphragms formed according to the disclosed embodiments. The photographs show large area gold membranes devices fabricated on cavity-patterned $SiO_2$ substrate via solvent-assisted contact-transfer printing with increased transfer pad curing time and spacer layer silanization time, increased silane concentration and increased silanization temperature. FIG. 14A shows a large area gold diaphragm covering about 16,000 cavities, each having diameter of about 27 μm, to form a single geometry device. FIGS. 14B and 14C show arrays of large area gold membranes each covering about 4,000 cavities each having 27 μm diameter.

Figure 15:
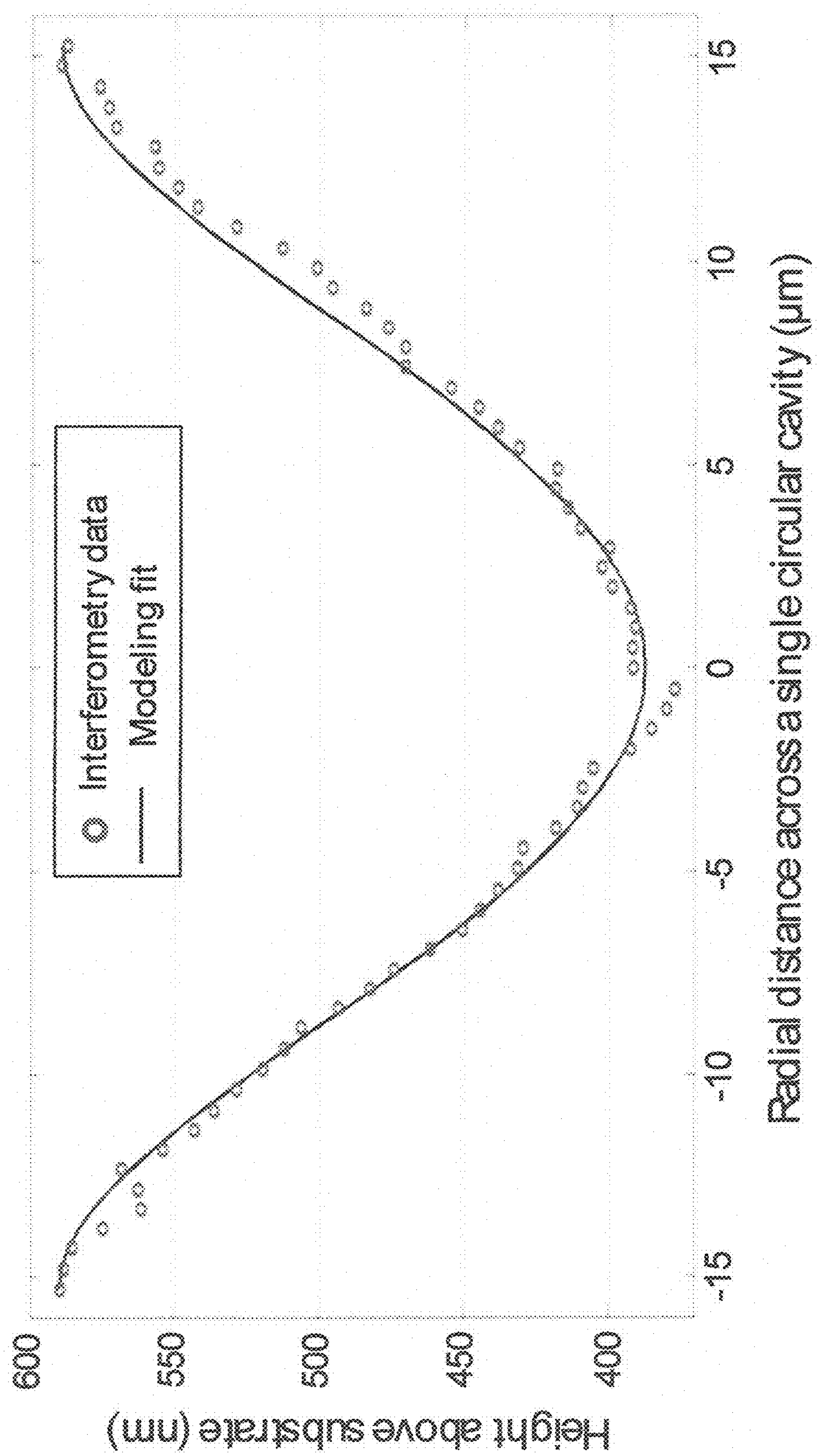
FIG. 15 shows the deflection profile of a gold diaphragm at 15V bias obtained by optical interferometry.

FIG. 15 shows the deflection profile of a gold diaphragm at 15V bias obtained by optical interferometry. In FIG. 15, the height of the diaphragm above the substrate was plotted against the radial distance across a single cavity. It can be readily seen that the deflection is highest at the center of the cavity.

Figures 16A, 16B, 16C:
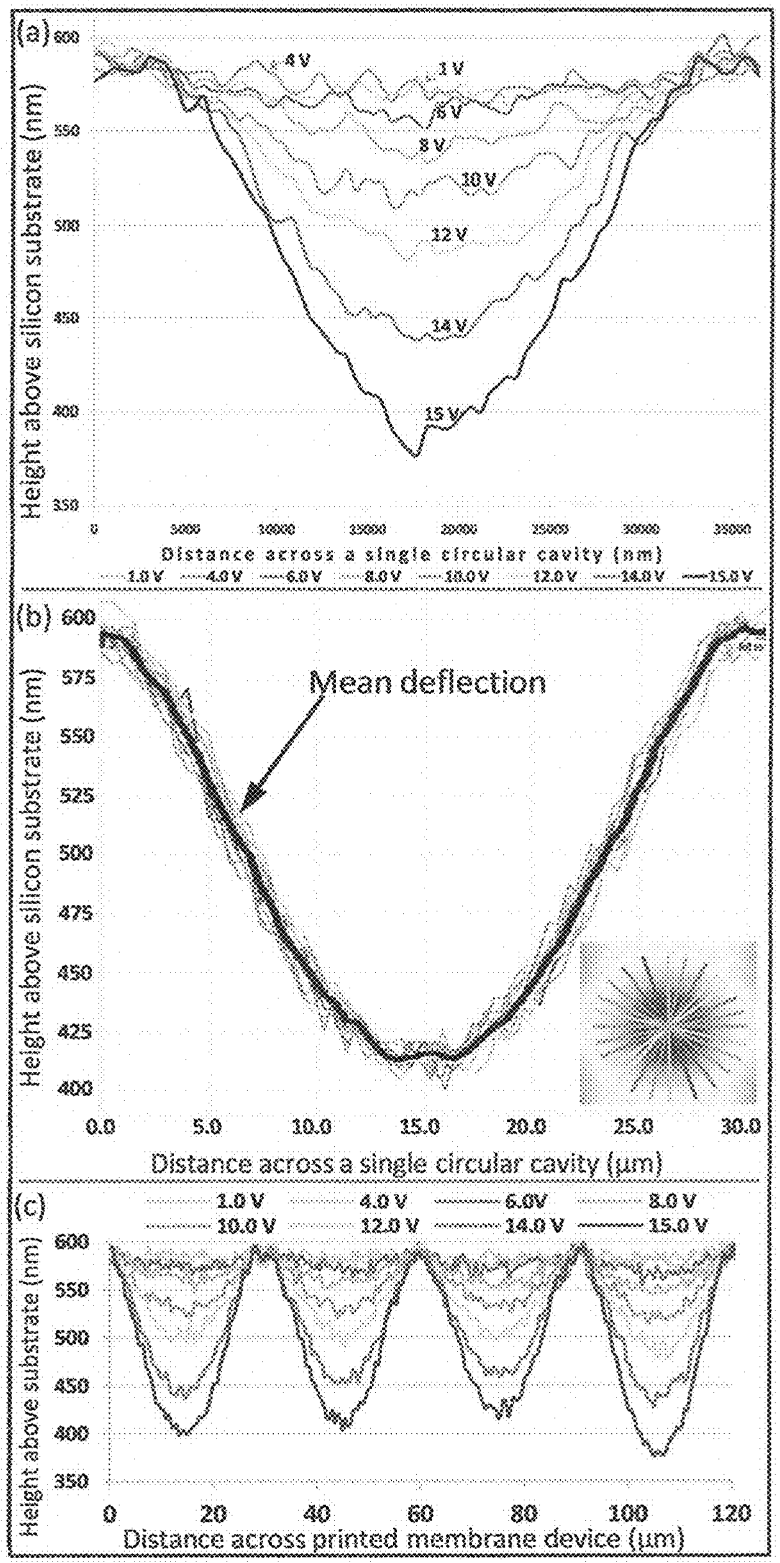
FIGS. 16A-16C represent deflection profiles of diaphragms under electrostatic pressure.

FIGS. 16A-16C represent deflection profiles of diaphragms under electrostatic pressure. Namely, the figures show deflection profiles of gold diaphragm under electrostatic actuation. The data was obtained by optical interferometry. In FIG. 16A, deflection of the membrane increases as the voltage applied between the membrane and the Si substrate increases. In FIG. 16B, thirteen different diametrical deflection profiles (inset: interferometry image) of a membrane under 15 V actuation are plotted and averaged to show the mean profile. In FIG. 16C, gold membrane deflection over multiple cavities covered by a single membrane increases as the voltage is increased from 1 V to 15 V.

As stated, another technique for weakening the release layer is to expose the interim structure to solvent vapor. The solvent vapor acts as an etchant for the organic release layer. Using a solvent vapor is similar to the acetone-assisted contact-transfer printing process (see Example 1), except that acetone is not applied as a wet solvent to the transfer pad that has a diaphragm deposited atop a release layer. Instead, after depositing the conducting diaphragm over the release layer, the pick-up stamp (or the patterned silicon-based substrate) is brought into conformal contact with the transfer pad to form an interim structure. The interim structure is then placed in a chamber and is exposed to a solvent vapor. The vapor helps release the conducting membrane onto the MEMS. The advantage of this process over the direct dissolution is that it removes wet solvent processing. The chamber may also provide other energy sources for weakening the release layer. For example, the chamber may also heat the interim structure or expose it to radiation to break the adhesion between the diaphragm and the PDMS substrate. Thus, the release layer may be dissolved prior to removing the interim structure from the chamber. It should be noted that the release layer may be activated (i.e., weakened) prior to forming the interim structure.

In another embodiment, the diaphragm is transferred onto a MEMS structure by chemical surface treatment of the patterned silicon-based substrate. According to this embodiment, a thin continuous diaphragm is transferred onto a patterned silicon-based substrate by altering the chemical properties of the substrate (the MEMS structure). This can be done, for example, by silanizing the surface of the substrate using an appropriate silane compound to encourage adhesion between the substrate and the diaphragm. The silane compound functions as a double-sided tape, adhering to the substrate and the diaphragm enabling the membrane to delaminate from the transfer pad as the substrate is lifted away. By treating the substrates with the appropriate silanes (e.g., phenyl ethyl trichlorosilane or 3-mercaptopropyltrimethoxysilane) transfer of monolayer or multiple layers of graphene or molybdenum disulfide onto silicon-based substrates is also feasible. The silane treatment method can also be used to enhance/enable the transfer of metal membranes as well, such as gold, silver, aluminum or combinations thereof. The chemical surface treatment of silicon-based substrates can also be used together with the solvent-assisted transfer of conductive membranes in order to ensure a better adhesion of the diaphragm to the silicon-based substrates. The chemical surface treatment method/silanization method could be used independent of any of the release-layer dissociation methods discussed earlier or in combination therewith.

The methods disclosed herein can be used to fabricate a wide variety of MEMS sensors, actuators and devices. Exemplary MEMS devices include pressure sensors, noise-cancelling headphones, high fidelity earphones, microphones, micro-pumps, speakers, hearing aids, ultrasound transducers, electrically-texture-adaptive surfaces, haptic feedback screens/surfaces, tunable lasers, and the large-area arrays of these sensors and actuators. Particularly suitable applications for deposition methods provided herein are array type sensors and actuators where a group of sensors/actuators can be activated independently. For example, a large array of actuators can be formed using the release-assisted method. A programmable controller having a microprocessor circuit in communication with a memory circuit can be configured to activate portions of the array depending on the actuation level.

Moreover, the disclosed processes can be used to generate multiple devices in a small spatial footprint. Multiple sensors/actuators or high sensor/actuator density is necessary for multiple applications, such as high quality earphone sound, spatially-resolved pressure sensing for structural integrity and wind tunnel testing, and phased array acoustic imaging. Since the MEMS sensors and actuators are typically capacitive in design, device power consumption is significantly lower which prolongs battery life.

Figure 17:
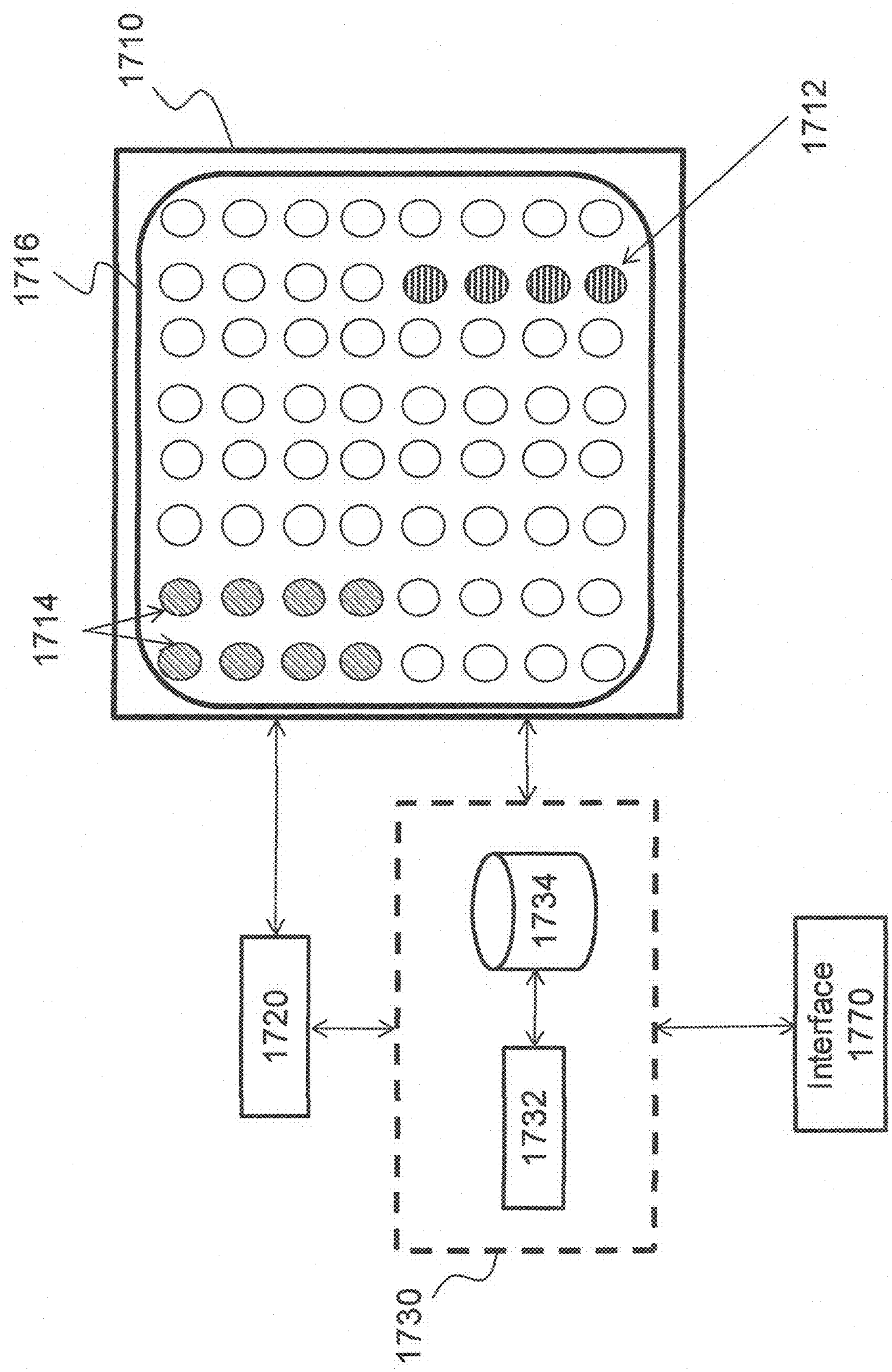
FIG. 17 shows an exemplary microprocessor-controlled array according to one embodiment of the disclosure.

FIG. 17 shows an exemplary microprocessor-controlled array according to one embodiment of the disclosure. In FIG. 17, MEMS device 1710 includes a number of cavities or pixels covered by diaphragm 1716. Cavities/pixels 1712 and 1714 define a first group and a second group of cavities, respectively. MEMS device 1710 communicates with controller 1730 either directly or through actuator 1720. Actuator 1720 may also define a sensor. Controller 1730 is shown with processor circuit 1732 in communication with memory circuit or database 1734. Controller 1730 also communicates with interface 1770 which can be any device capable of external communication (e.g., display, keyboard, etc.)

In an embodiment where MEMS device 1710 is implemented as a sensor, diaphragm 1716 is exposed to external or ambient energy which causes deflection of the diaphragm. The deflection can be communicated to controller 1730, which in-turn correlates the reported deflection to a quantifiable force. The detection can be made across the entire array of cavities/pixels or over a specified region. For example, the controller may report that ambient forces were detected in regions identified by group of cavities/pixels 1712 and/or 1714. Alternatively, controller 1730 may report varying forces detected across all cavities/pixels of device 1710. In this implementation, controller 1730 can correlate the location of detected energy with its corresponding magnitude.

In an embodiment where MEMS device 1710 is implemented as a transducer, controller 1730 identifies the cavities/pixels that need to be activated and the amount of desired deflection in each ones or groups of cavities/pixels. Here, the controller communicates the location and the desired activation bias to actuator 1720. The actuator may communicate the force to a voltage source (not shown) which would bias the desired cavity(ies) or pixel(s) accordingly. It should be noted that one or a plurality of cavities can be controlled in this manner. Alternatively, the entire MEMS device may be activated at one time. Moreover, different cavities can be activated with difference biases to produce a desired deflection.

While the principles of the disclosure have been illustrated in relation to the exemplary embodiments shown herein, the principles of the disclosure are not limited thereto and include any modification, variation or permutation thereof.

What is claimed is:

1. A method for microcontact printing of a MEMS structure, the method comprising:

forming a MEMS structure having an articulation thereon;

forming a release layer over a substrate and forming a diaphragm over the release layer, the release layer comprising a material selected from the group consisting of N,N'-diphenyl-N—N'-bis(3-methylphenyl)-(1, 1'-biphenyl)-4,4'-diamine ("TPD") and Alq3;

activating the release layer to facilitate detachment of the diaphragm from the substrate;

contacting the MEMS structure with the diaphragm; and separating the substrate from the diaphragm to leave the diaphragm covering at least a portion of the articulation.

2. The method of claim 1, wherein activating the release layer further comprises treating the release layer with a first material to dissolve the release layer and separate the diaphragm from the substrate.

3. The method of claim 1, wherein activating the release layer further comprises treating the release layer with a first material to substantially degrade the release layer prior to contacting the MEMS structure with the diaphragm.

4. The method of claim 2, wherein the first material is a solvent or a solvent vapor.

5. The method of claim 1, wherein activating the release layer further comprises treating the release layer with a first material to substantially dissolve the release layer.

6. The method of claim 1, wherein activating the release layer further comprises treating the release layer with a first material to substantially break the chemical bonds between the release layer and the diaphragm.

7. The method of claim 1, wherein activating the release layer further comprises treating the release layer with a first material to reduce intermolecular forces between the release layer and substrate or diaphragm or both.

8. The method of claim 1, wherein the articulation defines a plurality of ridges.

9. The method of claim 1, wherein the articulation defines a plurality of dimples.

10. The method of claim 1, wherein the MEMS structure defines a patterned feature on an insulator material, a semiconductor material, a conductive material, two conductive materials separated by an insulator material or a semiconductor material, or a combination thereof.

11. The method of claim 10, wherein the conductive materials further comprise metals and the semiconductor materials further comprise organic materials.

12. The method of claim 1, wherein the diaphragm is a composite of a plurality of material.

13. The method of claim 1, wherein the diaphragm is a composite of conductive and non-conductive material.

14. A method for microcontact printing of a MEMS structure, the method comprising:

forming a MEMS structure having an articulation thereon;

forming a release layer having a thickness of about of 90-250 nm over a substrate and forming a diaphragm over the release layer, the release layer comprising a material selected from the group consisting of N,N'-diphenyl-N—N'-bis(3-methylphenyl)-(1,1'-biphenyl)-4,4'-diamine ("TPD") and Alq3;

activating the release layer to facilitate detachment of the diaphragm from the substrate;

contacting the MEMS structure with the diaphragm; and separating the substrate from the diaphragm to leave the diaphragm covering at least a portion of the articulation.

15. A method for microcontact printing of a MEMS structure, the method comprising:

forming a MEMS structure having an articulation thereon;

forming a release layer over a substrate and forming a diaphragm having a thickness of about 70-250 nm over the release layer, the release layer comprising a material selected from the group consisting of N,N'-diphenyl-N—N'-bis(3-methylphenyl)-(1,1'-biphenyl)-4,4'-diamine ("TPD") and Alq3;

activating the release layer to facilitate detachment of the diaphragm from the substrate;

contacting the MEMS structure with the diaphragm; and separating the substrate from the diaphragm to leave the diaphragm covering at least a portion of the articulation.

* * * * *